(12) United States Patent
Kirihara et al.

(10) Patent No.: US 10,416,231 B2
(45) Date of Patent: Sep. 17, 2019

(54) ELECTRONIC COMPONENT TRANSPORT APPARATUS AND ELECTRONIC COMPONENT INSPECTION APPARATUS

(71) Applicant: Seiko Epson Corporation, Tokyo (JP)

(72) Inventors: Daisuke Kirihara, Azumino (JP); Masami Maeda, Suwa (JP); Toshioki Shimojima, Chino (JP); Takashi Yamazaki, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/558,771

(22) PCT Filed: Feb. 3, 2016

(86) PCT No.: PCT/JP2016/000565
§ 371 (c)(1),
(2) Date: Sep. 15, 2017

(87) PCT Pub. No.: WO2016/147533
PCT Pub. Date: Sep. 22, 2016

(65) Prior Publication Data
US 2018/0074119 A1 Mar. 15, 2018

(30) Foreign Application Priority Data

Mar. 16, 2015 (JP) .................. 2015-051772
Mar. 16, 2015 (JP) .................. 2015-051778

(51) Int. Cl.
*G01R 31/28* (2006.01)
*H01L 21/673* (2006.01)
*H01L 21/67* (2006.01)

(52) U.S. Cl.
CPC ..... *G01R 31/2893* (2013.01); *G01R 31/2891* (2013.01); *H01L 21/6719* (2013.01); *H01L 21/67126* (2013.01); *H01L 21/67288* (2013.01); *H01L 21/67356* (2013.01); *H01L 21/67373* (2013.01); *H01L 21/67376* (2013.01); *H01L 21/67379* (2013.01); *H01L 21/67386* (2013.01); *H01L 21/67389* (2013.01)

(58) Field of Classification Search
CPC ............ G01R 31/2893; G01R 31/2891; H01L 21/67126; H01L 21/6719; H01L 21/67288;
(Continued)

(56) References Cited

U.S. PATENT DOCUMENTS

| | | | |
|---|---|---|---|
| 2003/0031602 A1 | 2/2003 | Weselak et al. | |
| 2004/0158348 A1* | 8/2004 | Foulke | G03F 7/70741 700/218 |

(Continued)

FOREIGN PATENT DOCUMENTS

| | | |
|---|---|---|
| JP | 62-298780 A | 12/1987 |
| JP | 10-068756 A | 3/1998 |

(Continued)

*Primary Examiner* — Kaitlin S Joerger
(74) *Attorney, Agent, or Firm* — Harness, Dickey & Pierce, P.L.C.

(57) ABSTRACT

An electronic component transport apparatus includes: an openable and closable first opening and closing portion; a first rotation support portion which supports the first opening and closing portion to be rotatable; a second opening and closing portion provided to be openable and closable in the first opening and closing portion; and a second rotation support portion which supports the second opening and closing portion to be rotatable. An area of the first opening and closing portion is greater than an area of the second opening and closing portion.

14 Claims, 20 Drawing Sheets

(58) Field of Classification Search
CPC ......... H01L 21/67356; H01L 21/67373; H01L 21/67376; H01L 21/67379; H01L 21/67386; H01L 21/67389
USPC .............................................. 414/217, 217.1
See application file for complete search history.

(56) References Cited

U.S. PATENT DOCUMENTS

| | | | | |
|---|---|---|---|---|
| 2008/0138179 | A1* | 6/2008 | Flitsch | H01L 21/67017 414/217.1 |
| 2010/0241271 | A1* | 9/2010 | Shimizu | H01L 21/67766 700/218 |
| 2010/0316467 | A1* | 12/2010 | Ishibashi | B65G 37/02 414/217.1 |
| 2011/0298630 | A1 | 12/2011 | Kiyokawa et al. | |

FOREIGN PATENT DOCUMENTS

| | | |
|---|---|---|
| JP | 2000-035458 A | 2/2000 |
| JP | 2005-500522 A | 1/2005 |
| JP | 2005-280976 A | 10/2005 |
| JP | 2007-209257 A | 8/2007 |
| JP | 2011-220631 A | 11/2011 |
| TW | 201212146 A | 3/2012 |
| WO | WO-03-008103 A1 | 1/2003 |
| WO | WO-2011-016096 A1 | 2/2011 |

* cited by examiner

ELECTRONIC COMPONENT TRANSPORT APPARATUS AND ELECTRONIC COMPONENT INSPECTION APPARATUS

BACKGROUND

Technical Field

The present invention relates to an electronic component transport apparatus and an electronic component inspection apparatus.

Background Art

In the related art, an electronic component inspection apparatus which inspects electric characteristics of an electronic component, such as an IC device, is known, and an electronic component transport apparatus for transporting the IC device to a holding portion of an inspection portion is incorporated in the electronic component inspection apparatus. When inspecting the IC device, the IC device is disposed in the holding portion, and a plurality of probe pins provided in the holding portion are brought into contact with each terminal of the IC device.

In the inspection of the IC device, there is a case where the inspection is performed by cooling the IC device to a predetermined temperature. In this case, it is necessary to tightly close the inside of an inspection region in which the IC device is inspected is covered with a cover.

However, in JP-A-2000-35458, when performing jam releasing, for example, with respect to the IC device in the tightly closed inspection region, there is a case where the cover is in an open state more than necessary, and in this case, a large amount of external air including moisture flows thereinto, and there is a problem that a possibility that dew condensation is generated in the IC device or the like increases.

An object of the invention is to provide an electronic component transport apparatus and the electronic component inspection apparatus which can suppress an inflow of external air as much as possible when performing work with respect to the inside of the apparatus.

SUMMARY

The object is achieved by application examples of the invention described in the following.

Application Example 1

An electronic component transport apparatus according to the application example includes: an openable and closable first opening and closing portion; and a second opening and closing portion provided to be openable and closable in the first opening and closing portion.

With this configuration, when performing work with respect to the inside of the electronic component transport apparatus (apparatus), it is possible to perform the work while the second opening and closing portion is in an open state, and thus, it is possible to suppress an inflow of external air as much as possible.

Application Example 2

In the electronic component transport apparatus according to the application example, it is preferable that an area of the first opening and closing portion is greater than an area of the second opening and closing portion.

With this configuration, when performing the work with respect to the inside of the apparatus, it is possible to easily put in and out the arms of adults in general, for example, via the second opening and closing portion which is in an open state.

Application Example 3

In the electronic component transport apparatus according to the application example, it is preferable that a first rotation support portion which supports the first opening and closing portion to be rotatable, is provided.

With this configuration, it is possible to smoothly open and close the first opening and closing portion.

Application Example 4

In the electronic component transport apparatus according to the application example, it is preferable that a second rotation support portion which supports the second opening and closing portion to be rotatable, is provided.

With this configuration, it is possible to smoothly open and close the second opening and closing portion.

Application Example 5

In the electronic component transport apparatus according to the application example, it is preferable that a biasing portion which biases the second opening and closing portion is provided in the second rotation support portion.

With this configuration, it is possible to prevent the second opening and closing portion after the work from being left closed.

Application Example 6

In the electronic component transport apparatus according to the application example, it is preferable that the second rotation support portion is disposed vertically above the second opening and closing portion.

With this configuration, it is possible to close the second opening and closing portion by a self load.

Application Example 7

In the electronic component transport apparatus according to the application example, it is preferable that the second opening and closing portion is open toward the inside or open toward the outside of the electronic component transport apparatus.

With this configuration, an operability when opening and closing the second opening and closing portion is improved.

Application Example 8

In the electronic component transport apparatus according to the application example, it is preferable that the second opening and closing portion is supported to be slidable by the first opening and closing portion.

With this configuration, an outer shape of the apparatus is prevented from changing regardless of the opening and closing of the second opening and closing portion, and thus, a degree of freedom in an installation location of the apparatus increases.

Application Example 9

In the electronic component transport apparatus according to the application example, it is preferable that a plurality of the first opening and closing portions are disposed.

With this configuration, when the first opening and closing portion is open to be as close as possible to a part to which the work on the inside of the apparatus is desired to be performed, it is possible to easily perform the work.

Application Example 10

In the electronic component transport apparatus according to the application example, it is preferable that a plurality of the second opening and closing portions are disposed in the first opening and closing portions.

With this configuration, for example, the worker can use both hands by inserting a left hand while one second opening and closing portion is in an open state and by inserting a right hand while the other second opening and closing portion is in an open state, and thus, workability is improved.

Application Example 11

In the electronic component transport apparatus according to the application example, it is preferable that a transport area to which an electronic component is transported, is provided, and the second opening and closing portion is disposed in the vicinity of the transport area.

With this configuration, when the second opening and closing portion is in an open state, it is possible to perform the work into a transport area without opening the first opening and closing portion.

Application Example 12

In the electronic component transport apparatus according to the application example, it is preferable that a placement portion in which the electronic component is placed is provided in the transport area, and the second opening and closing portion is disposed further vertically above the placement portion.

With this configuration, when the second opening and closing portion is in an open state, it is possible to achieve a state where the placement portion is at a position lower than a line of sight of the worker, and thus, it is possible to immediately perform the work with respect to the placement portion.

Application Example 13

In the electronic component transport apparatus according to the application example, it is preferable that a first locking mechanism which is capable of locking the first opening and closing portion and a second locking mechanism which is capable of locking the second opening and closing portion, are disposed.

With this configuration, for example, it is possible to prevent the first opening and closing portion or the second opening and closing portion from being in an open state mistakenly by the worker.

Application Example 14

In the electronic component transport apparatus according to the application example, it is preferable that at least one locking mechanism which is capable of locking the first opening and closing portion and the second opening and closing portion is disposed.

With this configuration, it is possible to make a configuration and a control of the apparatus simple.

Application Example 15

An electronic component inspection apparatus according to this application example includes: an openable and closable first opening and closing portion; a second opening and closing portion provided to be openable and closable in the first opening and closing portion; and an inspection portion which inspects an electronic component.

With this configuration, when performing the work with respect to the inside of the apparatus, it is possible to perform the work while the second opening and closing portion is in an open state, and to suppress the inflow of the external air as much as possible.

Application Example 16

An electronic component transport apparatus according to this application example includes: an openable and closable first opening and closing portion; a second opening and closing portion provided to be openable and closable in the first opening and closing portion; and a notification portion which notifies at least one of open and closed states of the first opening and closing portion and the second opening and closing portion.

With this configuration, when performing the work with respect to the inside of the apparatus, it is possible to suppress the inflow of the external air as much as possible.

Application Example 17

In the electronic component transport apparatus according to the application example, it is preferable that the notification portion is capable of outputting light generation, alarm sound, voice, or a combination of at least two of the light generation, the alarm sound, and the voice.

With this configuration, when performing the work with respect to the inside of the apparatus, it is possible to urge the worker to close the first opening and closing portion or the second opening and closing portion which are in an open state as fast as possible. Accordingly, it is possible to shorten the time in an open state, and thus, it is possible to suppress the inflow of the external air to the inside of the apparatus as much as possible.

Application Example 18

In the electronic component transport apparatus according to the application example, it is preferable that the notification portion is a display screen which displays the open and closed states.

With this configuration, when performing the work with respect to the inside of the apparatus, it is possible to visually urge the worker to close the first opening and closing portion or the second opening and closing portion which is in an open state as fast as possible. Accordingly, it is possible to shorten the time of being in an open state, and thus, to suppress the inflow of the external air to the inside of the apparatus as much as possible.

Application Example 19

In the electronic component transport apparatus according to the application example, it is preferable that a first notification portion which notifies open and closed states of the first opening and closing portion and a second notification portion which notifies open and closed states of the second opening and closing portion are capable of being displayed on the display screen.

With this configuration, it is possible to grasp whether the open and closed states of the first opening and closing portion or the open and closed states of the second opening and closing portion is notified.

Application Example 20

In the electronic component transport apparatus according to the application example, it is preferable that the first notification portion and the second notification portion are different from each other at least in one of color, shape, size, and lighting state.

With this configuration, it is possible to easily grasp whether the open and closed states of the first opening and closing portion or the open and closed states of the second opening and closing portion is notified.

Application Example 21

In the electronic component transport apparatus according to the application example, it is preferable that the notification portion includes a first notification portion which notifies the open and closed states of the first opening and closing portion and the second notification portion which notifies the open and closed states of the second opening and closing portion.

With this configuration, it is possible to set the notification of the open and closed states which corresponds to the user who uses the apparatus, and thus, operability for the user is improved.

Application Example 22

In the electronic component transport apparatus according to the application example, it is preferable that, after the notification by the notification portion, in a case where elapsed time exceeds a time determined in advance, an instruction for closing at least one of the first opening and closing portion and the second opening and closing portion which are in an open state is possible.

With this configuration, it is possible to suppress the inflow of the external air to the inside of the apparatus as much as possible.

Application Example 23

In the electronic component transport apparatus according to the application example, it is preferable that, after the notification by the notification portion, in a case where a humidity or a temperature exceeds a humidity or a temperature determined in advance, an instruction for closing at least one of the first opening and closing portion and the second opening and closing portion which are in an open state is possible.

With this configuration, it is possible to further suppress the inflow of the external air to the inside of the apparatus as much as possible.

Application Example 24

In the electronic component transport apparatus according to the application example, it is preferable that a movable moving portion which is provided in a region to which an electronic component is transported, and a sensor which is capable of sensing the opening and closing of the first opening and closing portion and the second opening and closing portion, are provided, and in a case where the sensor senses the open states of the first opening and closing portion and the second opening and closing portion, the moving portion is stopped.

With this configuration, it is possible to ensure safety of the worker who performs the work.

Application Example 25

In the electronic component transport apparatus according to the application example, it is preferable that a movable moving portion which is provided in a region to which an electronic component is transported, and a locking portion which maintains a closed state of the first opening and closing portion and the second opening and closing portion are provided, and after the notification by the notification portion, in a case where the movement of the moving portion is stopped, maintaining of the closed state by the locking portion is released.

With this configuration, for example, it is possible to omit an operation of a switch for opening the first opening and closing portion and the second opening and closing portion, and to open the first opening and closing portion and the second opening and closing portion.

Application Example 26

An electronic component inspection apparatus according to this application example includes: an openable and closable first opening and closing portion; a second opening and closing portion provided to be openable and closable in the first opening and closing portion; a notification portion which notifies an open and closed state of at least one of the first opening and closing portion and the second opening and closing portion; and an inspection portion which inspects an electronic component.

With this configuration, when performing the work with respect to the inside of the apparatus, it is possible to suppress the inflow of the external air as much as possible.

DETAILED DESCRIPTION

Hereinafter, an electronic component transport apparatus and an electronic component inspection apparatus according to the invention will be described in detail based on appropriate embodiments illustrated in the attached drawings.

Figure 1:
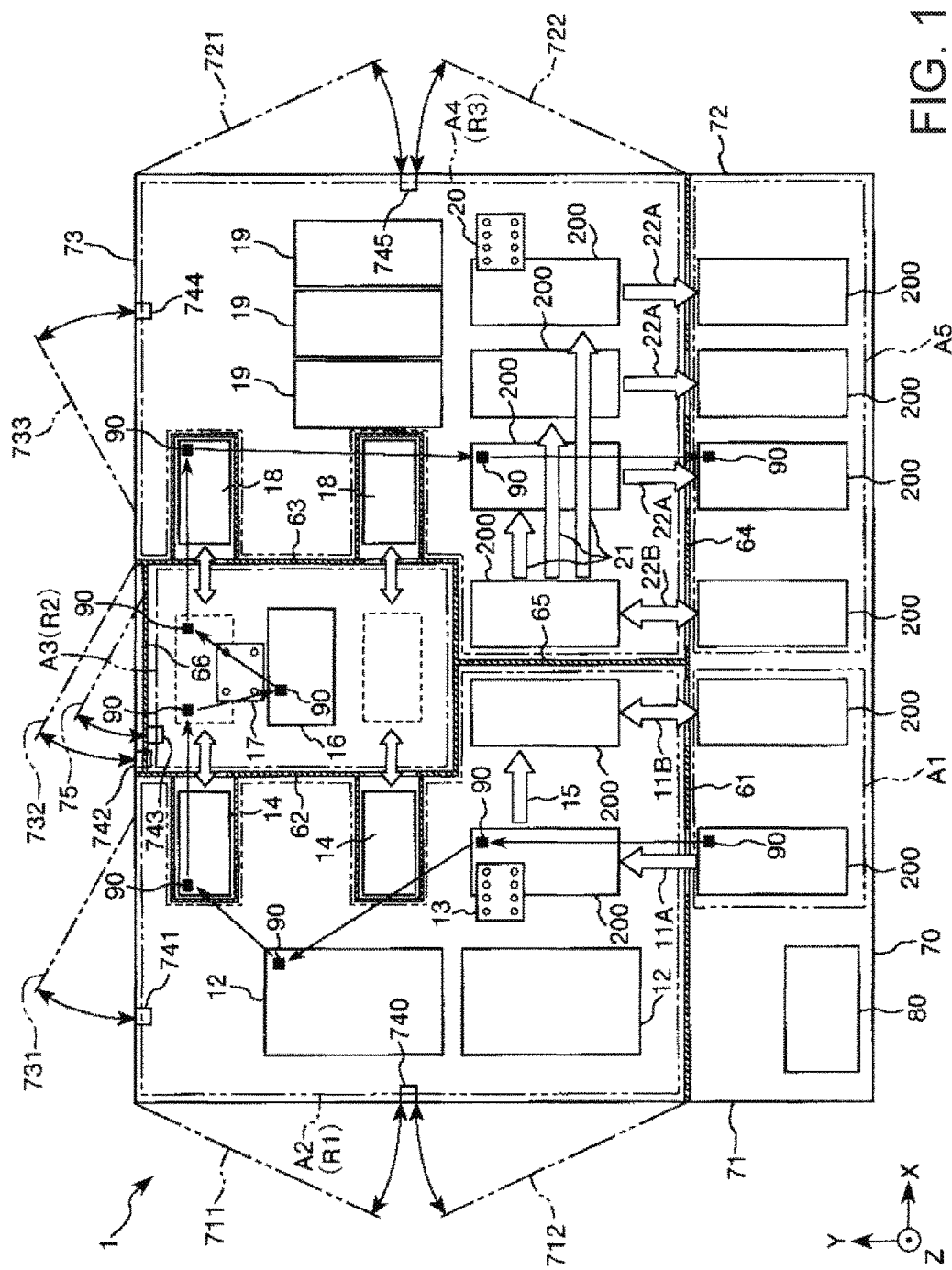
FIG. 1 is a schematic plan view illustrating a first embodiment of an electronic component inspection apparatus according to the invention.

In addition, in the following embodiments, for convenience of the description, for example, as illustrated in FIG. 1, three axes which intersect with each other are an X axis, a Y axis, and a Z axis. In addition, an XY plane including the X axis and the Y axis is horizontal, and the Z axis is vertical. In addition, a direction parallel to the X axis is also called "X direction", a direction parallel to the Y axis is also called "Y direction", and a direction parallel to the Z axis is also called "Z direction". In addition, an upstream side in a transport direction of an electronic component is also simply called "upstream side", and a downstream side is also called "downstream side". "Horizontal" referred in the specification is not limited to a complete horizontal state, and also includes a state of being slightly (for example, approximately less than 5°) inclined to the horizontal state as long as the transport of the electronic component is not interrupted.

An inspection apparatus (electronic component inspection apparatus) which will be described in the following embodiments is an apparatus for inspecting and testing (hereinafter, simply called "inspection") electric characteristics of the electronic component, such as an IC device (for example, a ball grid array (BGA) package or a land grid array (LGA) package), a liquid crystal display (LCD), and a CMOS image sensor (CIS). In addition, hereinafter, for convenience of the description, a case where the IC device is used as the electronic component to which the inspection will be performed is described as a representative example, and this is set to be "IC device 90".

First Embodiment

Figure 2:
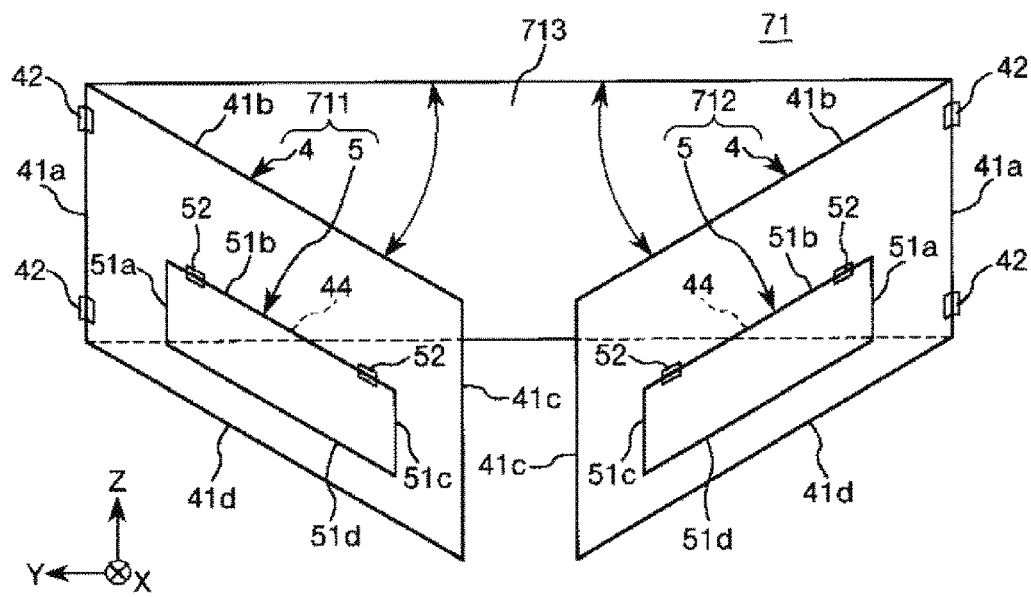
FIG. 2 is a view illustrating a first opening and closing portion in an open state and a second opening and closing portion in a closed state which are provided in the electronic component inspection apparatus illustrated in FIG. 1.
Figure 3:
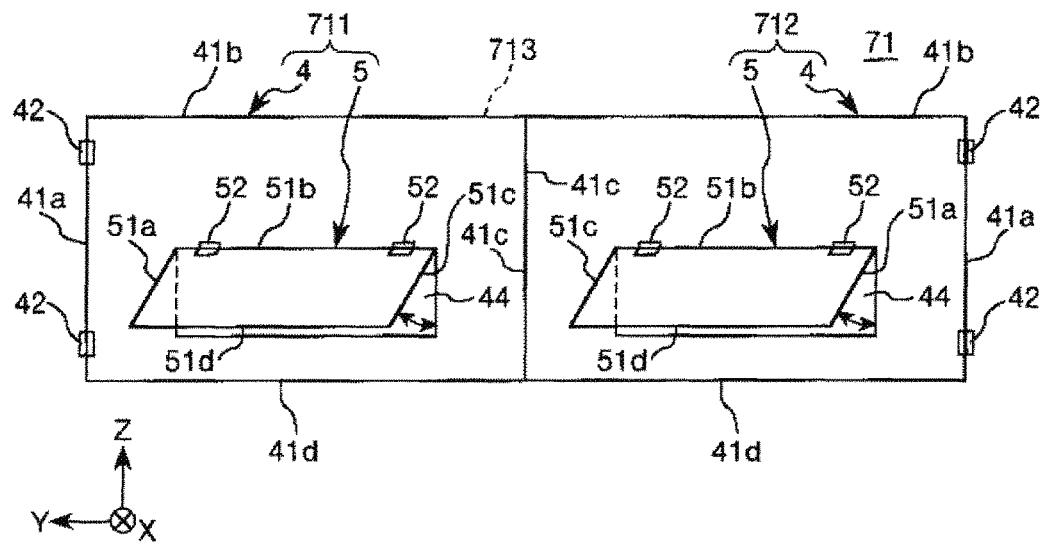
FIG. 3 is a view illustrating the first opening and closing portion in a closed state and the second opening and closing portion in an open state which are provided in the electronic component inspection apparatus illustrated in FIG. 1.
Figure 4:
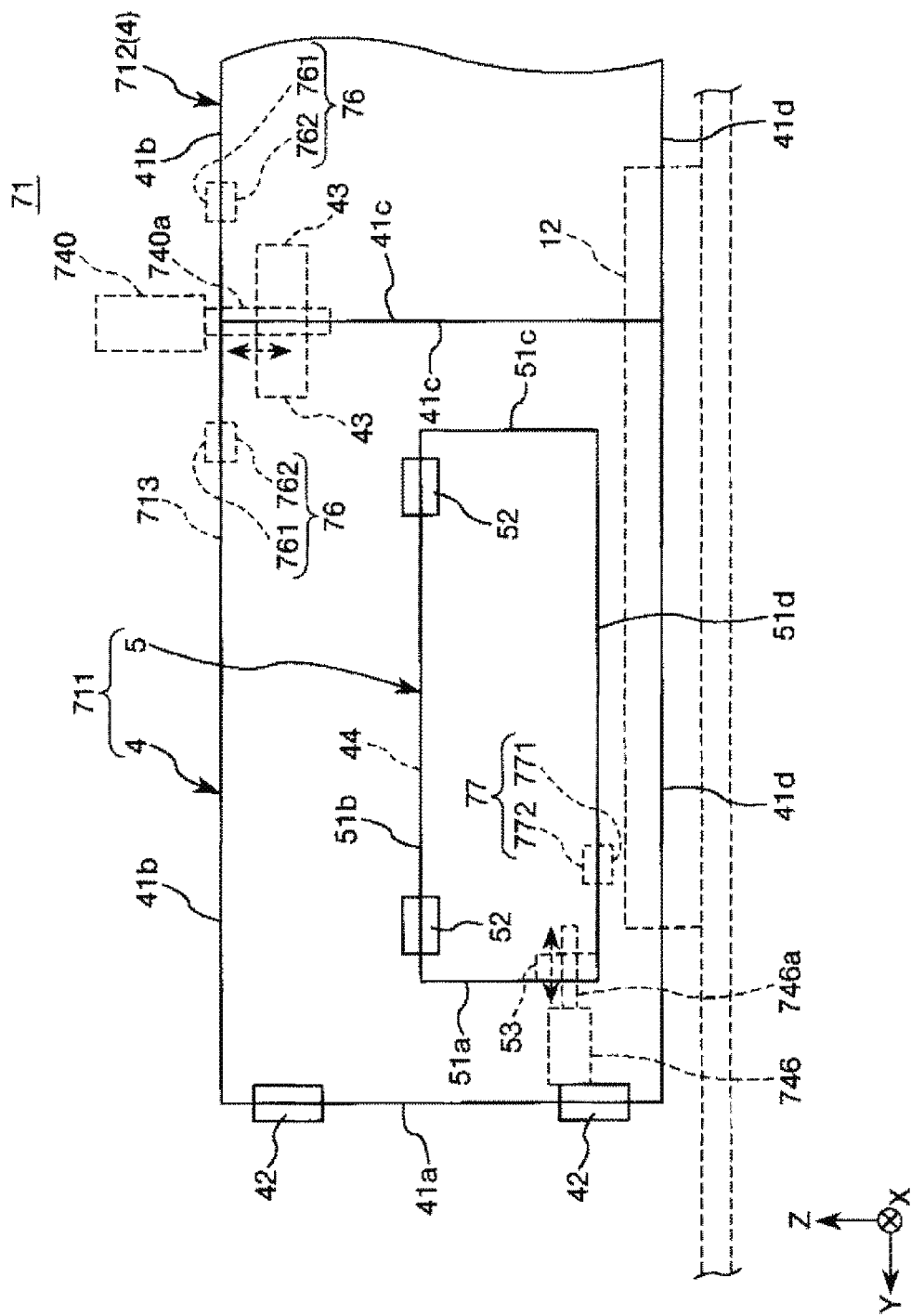
FIG. 4 is a view illustrating the second opening and closing portion provided in the electronic component inspection apparatus illustrated in FIG. 1 and the periphery thereof.
Figure 5:
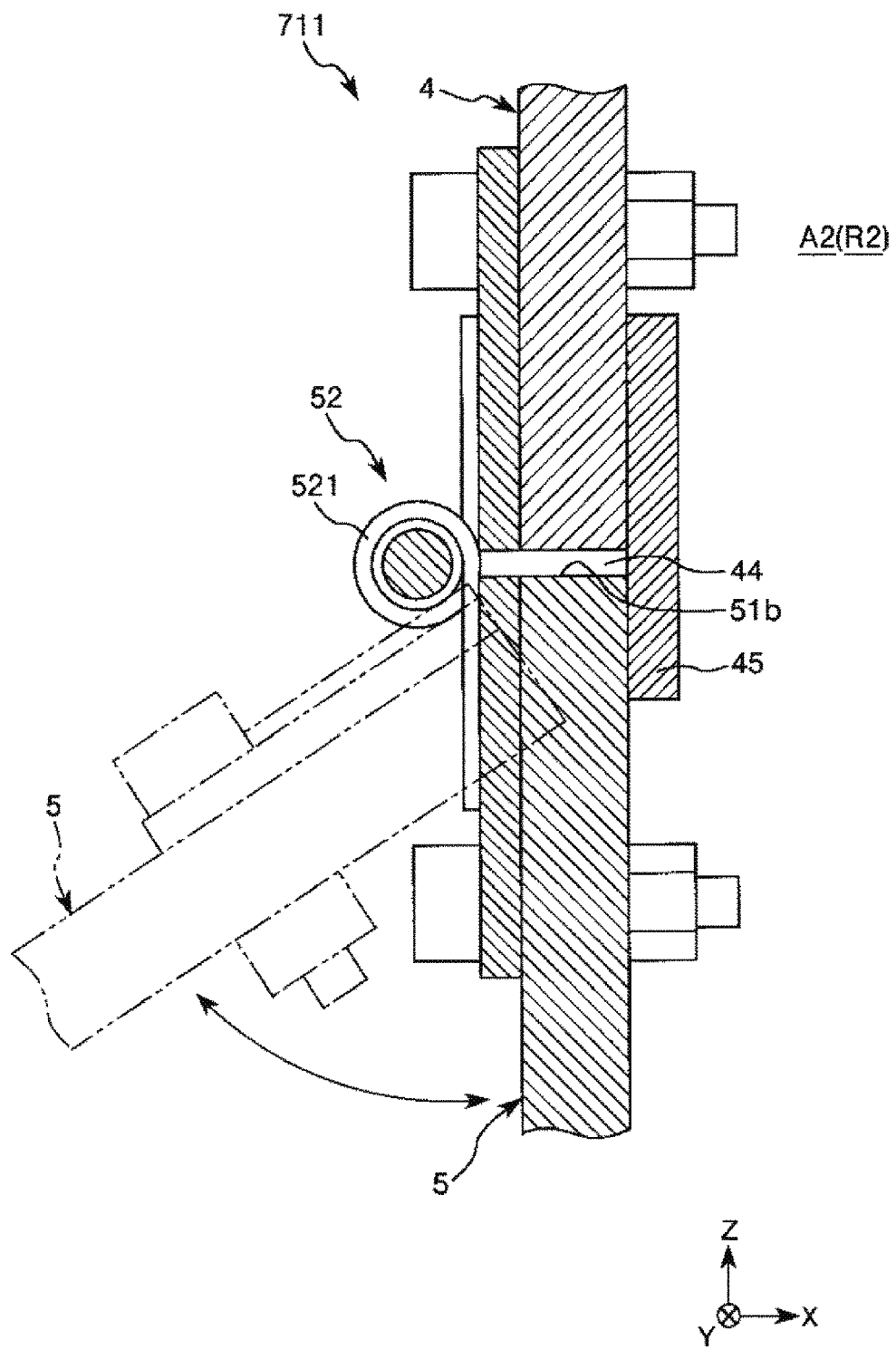
FIG. 5 is a sectional view illustrating the second opening and closing portion in open and closed states provided in the electronic component inspection apparatus illustrated in FIG. 1.
Figure 6:
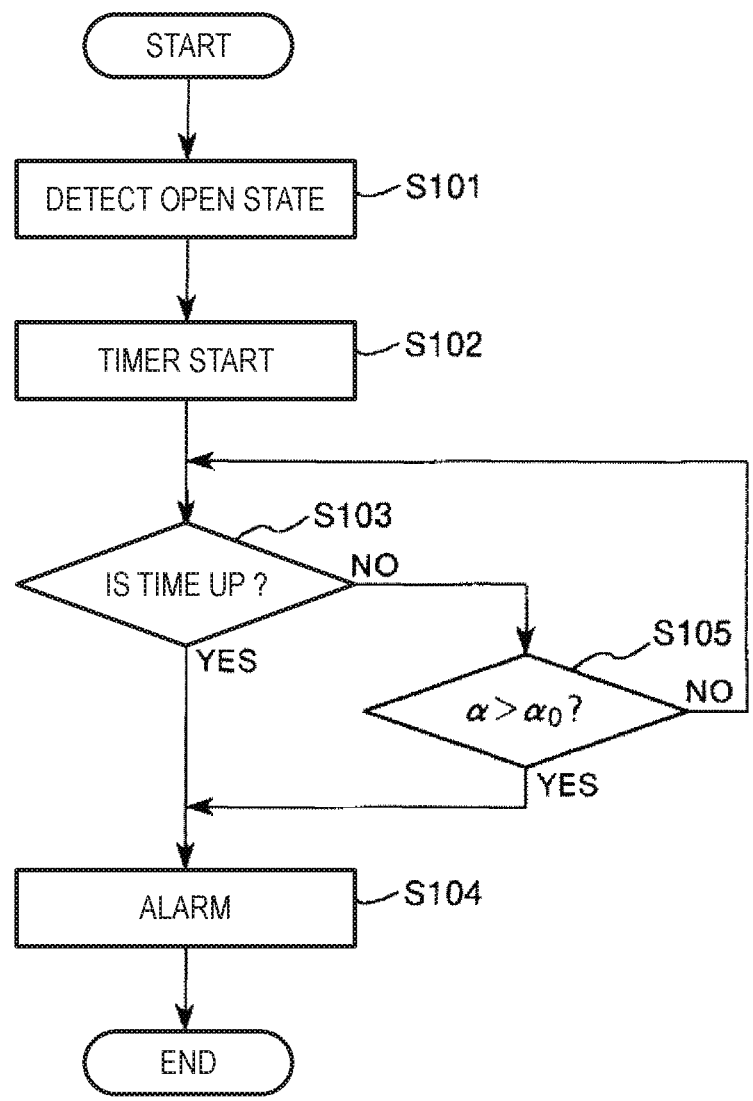
FIG. 6 is a flowchart illustrating a control program in the electronic component inspection apparatus illustrated in FIG. 1.

FIG. 1 is a schematic plan view illustrating a first embodiment of the electronic component inspection apparatus according to the invention. FIG. 2 is a view illustrating a first opening and closing portion in an open state and a second opening and closing portion in a closed state which are provided in the electronic component inspection apparatus illustrated in FIG. 1. FIG. 3 is a view illustrating the first opening and closing portion in a closed state and the second opening and closing portion in an open state which are provided in the electronic component inspection apparatus illustrated in FIG. 1. FIG. 4 is a view illustrating the second opening and closing portion provided in the electronic component inspection apparatus illustrated in FIG. 1 and the periphery thereof. FIG. 5 is a sectional view illustrating the second opening and closing portion in open and closed states provided in the electronic component inspection apparatus illustrated in FIG. 1. FIG. 6 is a flowchart illustrating a control program in the electronic component inspection apparatus illustrated in FIG. 1.

As illustrated in FIG. 1, an inspection apparatus (electronic component inspection apparatus) 1 is divided into a tray supply region A1, a device supply region (hereinafter, also simply called "supply region") A2, an inspection region A3, a device collection region (hereinafter, also simply called "collection region") A4, and a tray removal region A5. In addition, the IC device 90 is transported from the tray supply region A1 to the tray removal region A5 via the supply region A2, the inspection region A3, and the collection region A4 in order, and is subjected to an inspection at the inspection region A3 in a halfway position.

In this manner, the inspection apparatus 1 includes: an electronic component transport apparatus which transports the IC device 90 in the tray supply region A1, the supply region A2, the inspection region A3, the collection region A4, and the tray removal region A5; an inspection portion 16 which performs the inspection in the inspection region A3; and a control portion 80. In the inspection apparatus 1, in the region from the tray supply region A1 to the tray removal region A5, a region from the device supply region A2 to which the IC device 90 is transported to the device collection region A4 can also be called "transport region (transport area)".

In addition, the inspection apparatus 1 is used while a direction (a −Y direction side in FIG. 1) in which the tray supply region A1 and the tray removal region A5 are disposed is a front side, and an opposite side, that is, a direction (a +Y direction side in FIG. 1) in which the inspection region A3 is disposed, is a rear side.

The tray supply region A1 is a material supply portion to which trays (disposing members) 200, on which the plurality of IC devices 90 in an uninspected state are arranged (disposed) on an upper surface, are supplied. In the tray supply region A1, multiple trays 200 can be stacked.

The supply region A2 is a region in which the plurality of IC devices 90 which are transported in from the tray supply region A1 and disposed on the trays 200 are supplied to each of the inspection regions A3. In addition, tray transport mechanisms 11A and 11B which transport the trays 200 one by one are provided to be across the tray supply region A1 and the supply region A2.

In the supply region A2, a temperature adjustment portion (soak plate) 12, a device transport head 13, and a tray transport mechanism (first transport device) 15, are provided.

The temperature adjustment portion 12 is a placement portion in which the plurality of IC devices 90 are placed, and can heat or cool the plurality of IC devices 90. Accordingly, it is possible to adjust the IC device 90 to a temperature which is appropriate for the inspection.

In the configuration illustrated in FIG. 1, two temperature adjustment portions 12 are disposed in the Y direction and are fixed. In addition, the IC device 90 on the tray 200 transported in (that has been transported) from the tray supply region A1 by the tray transport mechanism 11A is transported to any of the temperature adjustment portions 12 and is placed.

The device transport head 13 is supported to be movable in the supply region A2. Accordingly, the device transport head 13 can perform a role of transporting the IC device 90 between the tray 200 transported in from the tray supply region A1 and the temperature adjustment portion 12, and transporting the IC device 90 between the temperature adjustment portion 12 and a device supply portion 14 which will be described later.

The tray transport mechanism 15 is a mechanism which transports the empty tray 200 in a state where all of the IC devices 90 are transported out in the X direction in the supply region A2. In addition, after the transportation, the empty tray 200 returns to the tray supply region A1 from the supply region A2 by the tray transport mechanism 11B.

The inspection region A3 is a region in which the IC device 90 is inspected. In the inspection region A3, the device supply portion (supply shuttle) 14, the inspection portion 16, a device transport head 17, and a device collection portion (collection shuttle) 18, are provided.

The device supply portion 14 is a placement portion in which the IC device 90 of which the temperature is adjusted is placed, and can transport the IC device 90 to the vicinity of the inspection portion 16. The device supply portion 14 is supported to be movable along the X direction between the supply region A2 and the inspection region A3. In addition, in the configuration illustrated in FIG. 1, two device supply portions 14 are disposed in the Y direction, and the IC device 90 on the temperature adjustment portion 12 is transported to any of the device supply portions 14 and is placed.

The inspection portion 16 is a unit that inspects and tests electric characteristics of the IC device 90. In the inspection portion 16, a plurality of probe pins which are electrically connected to terminals of the IC device 90 are provided in a state of holding the IC device 90. In addition, the terminal of the IC device 90 and the probe pin are electrically connected to each other (come into contact with each other), and the inspection of the IC device 90 is performed via the probe pins. The inspection of the IC device 90 is performed based on a program stored in an inspection control portion provided in a tester connected to the inspection portion 16. In addition, in the inspection portion 16, similar to the temperature adjustment portion 12, by heating or cooling the IC device 90, it is possible to adjust the IC device 90 to the temperature which is appropriate for the inspection.

The device transport head 17 is supported to be movable in the inspection region A3. Accordingly, the device transport head 17 can transport and place the IC device 90 on the device supply portion 14 transported in from the supply region A2 onto the inspection portion 16.

The device collection portion 18 is a placement portion in which the IC device 90 to which the inspection by the inspection portion 16 is finished is placed, and can transport the IC device 90 to the collection region A4. The device collection portion 18 is supported to be movable along the X direction between the inspection region A3 and the collection region A4. In addition, in the configuration illustrated in FIG. 1, similar to the device supply portion 14, two device collection portions 18 are disposed in the Y direction, and the IC device 90 on the inspection portion 16 is transported to any of the device collection portions 18, and is placed. The transportation is performed by the device transport head 17.

The collection region A4 is a region in which the plurality of IC devices 90 to which the inspection is finished are collected. In the collection region A4, a collection tray 19, a device transport head 20, and a tray transport mechanism (second transport apparatus) 21 are provided. In addition, in the collection region A4, the empty tray 200 is also prepared.

The collection tray 19 is a placement portion in which the IC device 90 is placed, and is fixed in the collection region A4, and in the configuration illustrated in FIG. 1, three collection trays 19 are disposed along the X direction. In addition, three empty trays 200 are also placement portions in which the IC devices 90 are placed, and are disposed along the X direction. In addition, the IC device 90 on the device collection portion 18 that has been moved to the collection region A4 is transported to any of the collection trays 19 and the empty trays 200, and is placed. Accordingly, the IC devices are collected for each inspection result, and are classified.

The device transport head 20 is supported to be movable in the collection region A4. Accordingly, the device transport head 20 can transport the IC device 90 to the collection tray 19 or the empty tray 200 from the device collection portion 18.

The tray transport mechanism 21 is a mechanism which transports the empty tray 200 that has been transported in from the tray removal region A5 in the X direction in the collection region A4. In addition, after the transportation, the empty tray 200 is disposed at a position at which the IC device 90 is collected, that is, can be in any of the three empty trays 200. In the inspection apparatus 1, the tray transport mechanism 21 is provided in the collection region A4, and in addition to this, the tray transport mechanism 15 is provided in the supply region A2. Accordingly, it is possible to improve throughput (the number of the IC devices 90 transported per unit time), for example, as compared with a case of transporting the empty tray 200 in the X direction by one transport mechanism.

In addition, a configuration of the tray transport mechanisms 15 and 21 is not particularly limited, and for example, a configuration in which a suctioning member which suctions the tray 200 and a supporting mechanism, such as a ball screw, which supports the suctioning member to be movable in the X direction, are provided is employed.

The tray removal region A5 is a material removal portion in which the tray 200 on which the plurality of IC devices 90 in a state where the inspection is finished are arranged is collected and removed. In the tray removal region A5, multiple trays 200 can be stacked.

In addition, tray transport mechanisms 22A and 22B which transport the trays 200 one by one are provided to be across the collection region A4 and the tray removal region A5. The tray transport mechanism 22A is a mechanism which transports the tray 200 on which the IC device 90 to which the inspection is finished is placed to the tray removal region A5 from the collection region A4. The tray transport mechanism 22B is a mechanism which transports the empty tray 200 for collecting the IC device 90 to the collection region A4 from the tray removal region A5.

The control portion 80 includes, for example, a driving control portion. The driving control portion controls, for example, the driving of each portion of the tray transport mechanisms 11A and 11B, the temperature adjustment portion 12, the device transport head 13, the device supply portion 14, the tray transport mechanism 15, the inspection portion 16, the device transport head 17, the device collection portion 18, the device transport head 20, the tray transport mechanism 21, and the tray transport mechanisms 22A and 22B.

In addition, an inspection control portion of the tester performs the inspection or the like of the electric characteristics of the IC device 90 disposed in the inspection portion 16, for example, based on the program stored in a memory which is not illustrated.

In the above-described inspection apparatus 1, in addition to the temperature adjustment portion 12 or the inspection portion 16, a configuration in which the device transport head 13, the device supply portion 14, and the device transport head 17 can also heat or cool the IC device 90 is employed. Accordingly, the temperature of the IC device 90 is maintained to be constant while being transported. In addition, hereinafter, a case where the cooling is performed to the IC device 90 and, for example, the inspection is performed under an environment where the temperature is low within a range of −60° C. to −40° C., will be described.

As illustrated in FIG. 1, in the inspection apparatus 1, a space between the tray supply region A1 and the supply region A2 is divided (partitioned) by a first partition wall 61, a space between the supply region A2 and the inspection region A3 is divided by a second partition wall 62, a space between the inspection region A3 and the collection region A4 is divided by a third partition wall 63, and a space between the collection region A4 and the tray removal region A5 is divided by a fourth partition wall 64. In addition, a space between the supply region A2 and the collection region A4 is also divided by a fifth partition wall 65. The partition walls have a function of holding air tightness of each region. Furthermore, in the inspection apparatus 1, the outermost part is covered with a cover, and the cover includes, for example, a front cover 70, side covers 71 and 72, and a rear cover 73.

In addition, the supply region A2 is a first room R1 which is defined by the first partition wall 61, the second partition wall 62, the fifth partition wall 65, the side cover 71, and the rear cover 73. In the first room R1, the plurality of IC devices 90 in an uninspected state are transported in for each of the trays 200.

The inspection region A3 is a second room R2 which is defined by the second partition wall 62, the third partition wall 63, and the rear cover 73. In addition, in the second room R2, an inner partition wall 66 is disposed further on the inside than the rear cover 73.

The collection region A4 is a third room R3 which is defined by the third partition wall 63, the fourth partition wall 64, the fifth partition wall 65, a side cover 72, and the rear cover 73. In the third room R3, the plurality of IC devices 90 to which the inspection is finished are transported in from the second room R2.

As illustrated in FIG. 1, in the side cover 71, a first door (a first door on a left side) 711 and a second door (a second door on a left side) 712 are provided. By opening the first door 711 or the second door 712, for example, it is possible to perform maintenance or releasing or the like of a jammed state in the IC device 90 (hereinafter, these are referred to as "work" as a total term) in the first room R1. In addition, the first door 711 and the second door 712 are a so-called "hinged double door" which are open and closed in the directions opposite to each other. In addition, when performing the work in the first room R1, the movable portion of the device transport head 13 or the like in the first room R1 is stopped.

Similarly, in the side cover 72, a first door (a first door on a right side) 721 and a second door (a second door on a right side) 722 are provided. By opening the first door 721 or the second door 722, for example, it is possible to perform work in the third room R3. In addition, the first door 721 and the second door 722 are also a so-called "hinged double door" which are open and closed in the directions opposite to each other. In addition, when performing the work in the third room R3, the movable portion of the device transport head 20 or the like in the third room R3 is stopped.

In addition, in the rear cover 73, a first door (a first door on a rear side) 731, a second door (a second door on a rear side) 732, and a third door (a third door on a rear side) 733 are provided. By opening the first door 731, for example, it is possible to perform work in the first room R1. By opening the third door 733, for example, it is possible to perform work in the third room R3. Furthermore, in the inner partition wall 66, a fourth door 75 is provided. In addition, by opening the second door 732 and the fourth door 75, for example, it is possible to perform work in the second room R2. In addition, the first door 731, the second door 732, and the fourth door 75 are open and closed in the same direction, and the third door 733 is open and closed in the direction opposite to the doors. In addition, when performing the work in the second room R2, the movable portion of the device transport head 17 or the like in the second room R2 is stopped.

In addition, by closing each of the doors, it is possible to ensure air tightness or heat insulating properties in each of the corresponding rooms.

However, in the inspection apparatus 1, among the doors, the first door 711 and the second door 712 on the side cover 71 side, the first door 721 and the second door 722 on the side cover 72 side, and the first door 731 and the third door 733 on the rear cover 73 side, are respectively configured of a first opening and closing portion 4 and a second opening and closing portion 5 (refer to FIGS. 2 and 3), and are made as an assembly made by assembling these. Hereinafter, the first door 711 which is on the side cover 71 side will be described as a representative example.

As illustrated in FIGS. 2 to 4, the first opening and closing portion 4 is a door which is openable and closable with respect to an opening portion 713 formed in the side cover 71. Accordingly, the first opening and closing portion 4 can cover a half (a part on a left side in the drawing) of the opening portion 713 in a closed state (refer to FIG. 3), and can open the opening portion 713 in an open state (refer to FIG. 2).

The first opening and closing portion 4 is configured of a plate member which makes a substantially rectangular shape in a plan view. In addition, the size of the first opening and closing portion 4 depends on the size of the inspection apparatus 1, but for example, any of the longitudinal length (length in the Z direction) and the horizontal length (length in the Y direction) is preferably from 400 mm to 600 mm, and is more preferably from 450 mm to 550 mm.

In addition, in the first opening and closing portion 4 which makes a rectangular shape, a side 41a which extends in the perpendicular direction among four sides (edge portions) 41a, 41b, 41c, and 41d is linked to the side cover 71 by two first rotation support portions 42. The two first rotation support portions 42 are disposed to be separated from each other in the Z direction. In addition, each of the first rotation support portions 42 is configured of a hinge which supports the first opening and closing portion 4 to be rotatable. Accordingly, it is possible to support the first opening and closing portion 4 using an axis parallel to the perpendicular direction, that is, the Z direction, as a rotation axis to be rotatable, and to smoothly perform the opening and closing thereof.

As illustrated in FIG. 4, a cylinder 740 which functions as a first locking mechanism that maintains a state where the first opening and closing portion 4 is closed is disposed in the vicinity (for example, 0 mm to 50 mm) of an upper part of the opening portion 713 of the side cover 71, and is fixed. In the cylinder 740, a cylinder rod 740a freely protrudes. In addition, when the cylinder rod 740a protrudes downward, the cylinder rod 740a can be engaged with a locking member 43 provided in the first opening and closing portion 4 (refer to FIG. 4). Accordingly, the closed state of the first opening and closing portion 4 is maintained, and for example, it is possible to prevent the first opening and closing portion 4 from being open mistakenly by an operator while the IC device 90 is transported.

In addition, in the embodiment, the cylinder 740 can maintain the closed state of the first opening and closing portion 4 of the second door 712 regardless of maintaining the closed state of the first opening and closing portion 4 of the first door 711. In other words, in the cylinder 740, the cylinder rod 740a can be collectively engaged with the locking member 43 of the first opening and closing portion 4 of the first door 711, and the locking member 43 of the first opening and closing portion 4 of the second door 712, and thus, it is possible to collectively maintain the closed state of the first opening and closing portions 4.

Similarly, on the side cover 72 side, a cylinder 745 can collectively maintain the closed state of the first door 721 and the second door 722. In addition, on the rear cover 73 side, a cylinder 741 can maintain the closed state of the first door 731, a cylinder 742 can maintain the closed state of the second door 732, a cylinder 744 can maintain the closed state of the third door 733, and a cylinder 743 can maintain the closed state of the fourth door 75. In addition, operations of the cylinders 740 to 745 are independently performed by using a predetermined switch.

As described above, the door configured of the first opening and closing portion 4 and the second opening and closing portion 5 includes the first door 711 and the second door 712 on the side cover 71 side, the first door 721 and the second door 722 on the side cover 72 side, and the first door 731 and the third door 733 on the rear cover 73 side. Therefore, the number of installations of the first opening and closing portions 4 is the number (plural number) which is the same as the number of the doors. Accordingly, with respect to a part to which the work in the transport region is desired to be performed, when opening the first opening and closing portion 4 as close as possible, it is possible to easily perform the work.

In addition, as illustrated in FIG. 4, a magnet sensor 761 and a magnet 762 which function as a detection portion 76 that detects the opening and closing of the first opening and closing portion 4 are provided. The magnet sensor 761 is disposed in the vicinity (for example, 0 mm to 50 mm) of the upper part of the opening portion 713 of the side cover 71, and is fixed, and is electrically connected to the control portion 80. When the magnet 762 is fixed to the first opening and closing portion 4 and the first opening and closing portion 4 is in a closed state, the magnet 762 is disposed at a position which is in the vicinity of, that is, which faces the magnet sensor 761.

As illustrated in FIGS. 2 to 4, in the first opening and closing portion 4, the second opening and closing portion 5 is provided. The second opening and closing portion 5 is a door which is openable and closable with respect to an opening portion 44 formed in the first opening and closing portion 4. Accordingly, the second opening and closing portion 5 can cover the opening portion 44 in a closed state (refer to FIG. 2), and can open the opening portion 44 in an open state (refer to FIG. 3). In addition, the second opening and closing portion 5 is configured of a plate member which makes a substantially rectangular shape in a plan view, and the area is smaller than the area of the first opening and closing portion 4. In addition, in the periphery of the opening portion 44 of the first opening and closing portion 4, a plate piece 45 for a stopper that prevents, when the second opening and closing portion 5 is in a closed state, the second opening and closing portion 5 from being inclined to the device supply region A2 side is provided (refer to FIG. 5). In addition, a packing (sealing material) may be installed in the plate piece 45. Accordingly, it is possible to appropriately hold air tightness between the second opening and closing portion 5 in a closed state and the plate piece 45.

As the second opening and closing portion 5 is provided, for example, when performing the work with respect to the temperature adjustment portion 12 (the inside of the inspection apparatus 1) in the device supply region A2, while the first opening and closing portion 4 is not in an open state and the second opening and closing portion 5 is in an open state, the work can be performed. Since the open state of the second opening and closing portion 5 is smaller than the open state of the first opening and closing portion 4, it is possible to suppress an inflow of external air to the inside of the device supply region A2 as much as possible during the work with respect to the temperature adjustment portion 12. Accordingly, a low-temperature environment in the device supply region A2 is held, and thus, it is possible to prevent dew condensation or hoarfrost from being generated in the IC device 90 or the like, and to rapidly perform an operation of the inspection apparatus 1 from a state where the second opening and closing portion 5 is reclosed.

In addition, the size of the second opening and closing portion 5 depends on the size of the first opening and closing portion 4, but for example, the longitudinal length (length in the Z direction) is preferably from 150 mm to 200 mm, and is more preferably from 180 mm to 200 mm, and the horizontal length (length in the Y direction) is preferably from 150 mm to 400 mm, and is more preferably from 200 mm to 360 mm. By the size, it is possible to easily put in and out the arms of adults in general or the tray 200 having a general size, for example, via the second opening and closing portion 5 which is in an open state. In addition, it is possible to prevent the head of the worker from entering via the second opening and closing portion 5 in an open state.

In addition, in the second opening and closing portion 5 which makes a rectangular shape, a side 51b which extends in the horizontal direction among four sides (edge portions) 51a, 51b, 51c, and 51d is linked to the first opening and closing portion 4 by two second rotation support portions 52. The two second rotation support portions 52 are disposed to be separated from each other in the Y direction. In addition, each of the second rotation support portions 52 is configured of a hinge which supports the second opening and closing portion 5 to be rotatable. Accordingly, it is possible to support the second opening and closing portion 5 using an axis parallel to the horizontal direction, that is, the Y direction, as a rotation axis to be rotatable, and to smoothly perform the opening and closing thereof.

In addition, as illustrated in FIG. 5, the hinge which configures the second rotation support portion 52 has a torsion spring 521 embedded therein. The torsion spring 521 functions as a biasing portion that biases the second opening and closing portion 5. Accordingly, the second opening and closing portion 5 is closed by a self load, and in addition to this, the second opening and closing portion 5 can also be closed by the biasing force by the torsion spring 521. Accordingly, it is possible to prevent the second opening and closing portion 5 after the work from being left closed.

As illustrated in FIGS. 3 and 5, in the embodiment, the second opening and closing portion 5 opens to the outside of the inspection apparatus 1. Accordingly, for example, in a case where the second opening and closing portion 5 in an open state is configured to regulate such that the second opening and closing portion 5 becomes perpendicular to the first opening and closing portion 4, it is possible to temporarily place a tool to be used in the work on the second opening and closing portion 5.

In addition, as illustrated in FIG. 4, as a disposition location of the second opening and closing portion 5, the second opening and closing portion 5 is preferably disposed in the vicinity of the temperature adjustment portion 12 in the device supply region A2 and further perpendicularly above the temperature adjustment portion 12. Here, regarding the "vicinity", the distance from the temperature adjustment portion 12 to the second opening and closing portion 5 is preferably approximately the length from the shoulder of adults in general to the fingertip (to the extent that the fingertip can reach in a case of being inserted to the shoulder), that is, 700 mm or shorter, and is more preferably approximately the length from the elbow to the fingertip (to the extent that the fingertip can reach in a case of being inserted to the elbow), that is, 500 mm or shorter. Accordingly, when the second opening and closing portion 5 is in an open state, a state where the temperature adjustment portion 12 is at a position which is lower than a line of sight of the operator who performs the work can be achieved, and thus, it is possible to immediately perform the work with respect to the temperature adjustment portion 12. In addition, by the rapid work, it is possible to shorten the time during which the second opening and closing portion 5 is in an open state as much as possible, and thus, it is possible to suppress the inflow of the external air to the inside of the device supply region A2.

A cylinder 746 which functions as a second locking mechanism that maintains a state where the second opening and closing portion 5 is closed is disposed in the vicinity (for example, 0 mm to 50 mm) of the opening portion 44 of the first opening and closing portion 4, and is fixed. In the cylinder 746, a cylinder rod 746a freely protrudes. In addition, when the cylinder rod 746a protrudes, the cylinder rod 746a can be engaged with a locking member 53 provided in the second opening and closing portion 5 (refer to FIG. 4). Accordingly, the closed state of the second opening and closing portion 5 is maintained, and for example, it is possible to prevent the second opening and closing portion 5 from being open mistakenly by the operator while the IC device 90 is transported. In addition, the operation of the cylinder 746 is performed by using a predetermined switch.

In addition, a magnet sensor 771 and a magnet 772 which function as a detection portion 77 that detects the opening and closing of the second opening and closing portion 5 are provided. The magnet sensor 771 is disposed in the vicinity (for example, 0 mm to 50 mm) of the lower part of the opening portion 44 of the first opening and closing portion 4, and is fixed, and is electrically connected to the control portion 80. The magnet 772 is fixed to the second opening and closing portion 5, and when the second opening and closing portion 5 is in a closed state, the magnet 772 is disposed at a position which is in the vicinity of, that is, which faces the magnet sensor 771.

In addition, when it is detected that the second opening and closing portion 5 is in an open state by the detection portion 77 (step S101 in FIG. 6), a timer which is embedded in the control portion 80 is operated (step S102). After this, it is determined whether or not the time is up, that is, whether or not a predetermined time has elapsed by the control portion 80 (step S103). In a case where it is determined that the time is up in step S103, for example, an alarm is generated by a monitor or a signal lamp, and in addition to this, by a speaker (any of these is not illustrated) (step S104). The alarm means that the low-temperature environment in the device supply region A2 is shifting to a state where the dew condensation is easily generated, and can urge the operator to make the second opening and closing portion 5 closed.

In addition, in a case where it is determined that the time is not up in step S103, it is determined whether or not a humidity (or the temperature detected by the temperature sensor (not illustrated)) $\alpha$ detected by a humidity sensor (not illustrated) in the device supply region A2 exceeds a threshold value $\alpha_0$ (step S105), and as a result of the determination, in a case where the humidity (or the temperature detected by the temperature sensor) exceeds the threshold value $\alpha_0$, an alarm is generated (step S104). Here, the threshold value $\alpha_0$ is a humidity at which the low-temperature environment in the device supply region A2 can be in a state where the dew condensation is easily generated.

Second Embodiment

Figure 7:
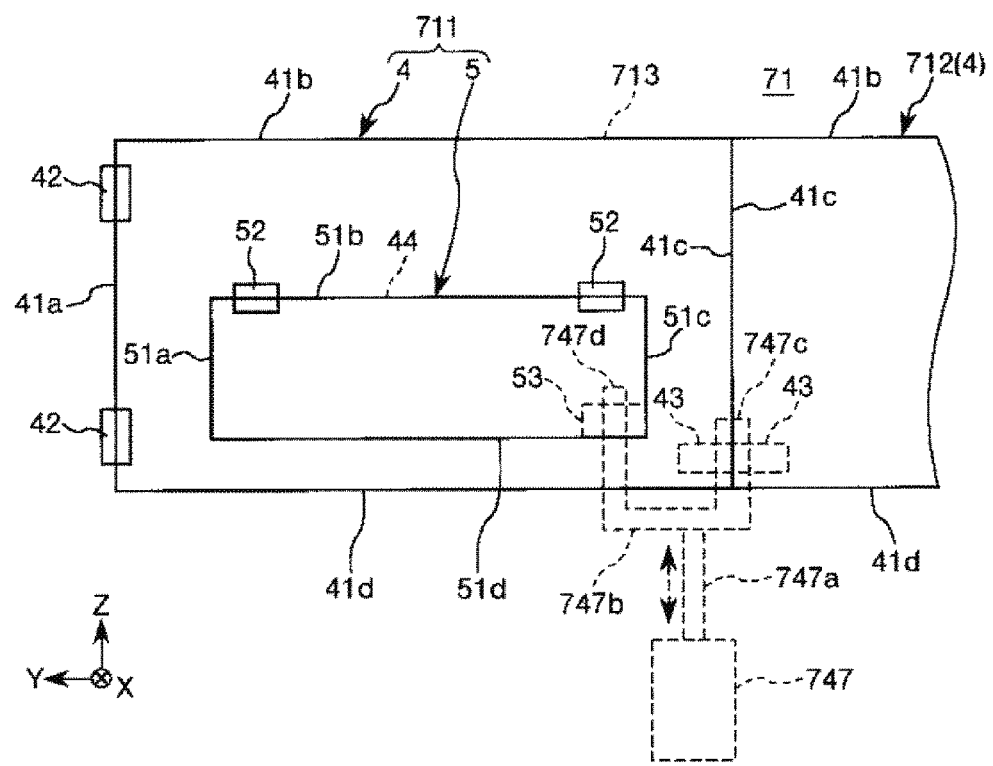
FIG. 7 is a view illustrating a second opening and closing portion provided in an electronic component inspection apparatus (second embodiment) according to the invention and the periphery thereof.

FIG. 7 is a view illustrating a second opening and closing portion provided in an electronic component inspection apparatus (second embodiment) according to the invention and the periphery thereof.

Hereinafter, the second embodiment of an electronic component transport apparatus and an electronic component inspection apparatus according to the invention will be described with reference to the drawings, but a difference between the embodiment and the above-described embodiment will be focused in the description, and the description of similar parts will be omitted.

The embodiment is similar to the first embodiment except that a configuration of the locking mechanism is different.

As illustrated in FIG. 7, in the first door 711 which is representatively illustrated, as the locking mechanism which collectively maintains a state where the first opening and closing portion 4 and the second opening and closing portion 5 are closed, one cylinder 747 is disposed in the vicinity (for example, 0 mm to 50 mm) of the lower part of the opening portion 713 of the side cover 71, and is fixed.

In the cylinder 747, a cylinder rod 747a freely protrudes. In addition, a tip end member 747b is connected to the tip end portion of the cylinder rod 747a. The tip end member 747b branches into a fork, and includes a first part 747c and a second part 747d. In addition, when the cylinder rod 747a protrudes upward, the first part 747c of the tip end member 747b can be engaged with the locking member 43 provided in the first opening and closing portion 4, and the second part 747d can be engaged with the locking member 53 provided in the second opening and closing portion 5. Accordingly, it is possible to collectively maintain a state where the first opening and closing portion 4 and the second opening and closing portion 5 are closed.

In the embodiment, it is possible to collectively maintain a closed state of the first opening and closing portion 4 and the second opening and closing portion 5 by one cylinder 747, and thus, it is possible to make the configuration of the inspection apparatus 1 simple, and to make the opening and closing control of the opening and closing portions simple.

Third Embodiment

Figure 8:
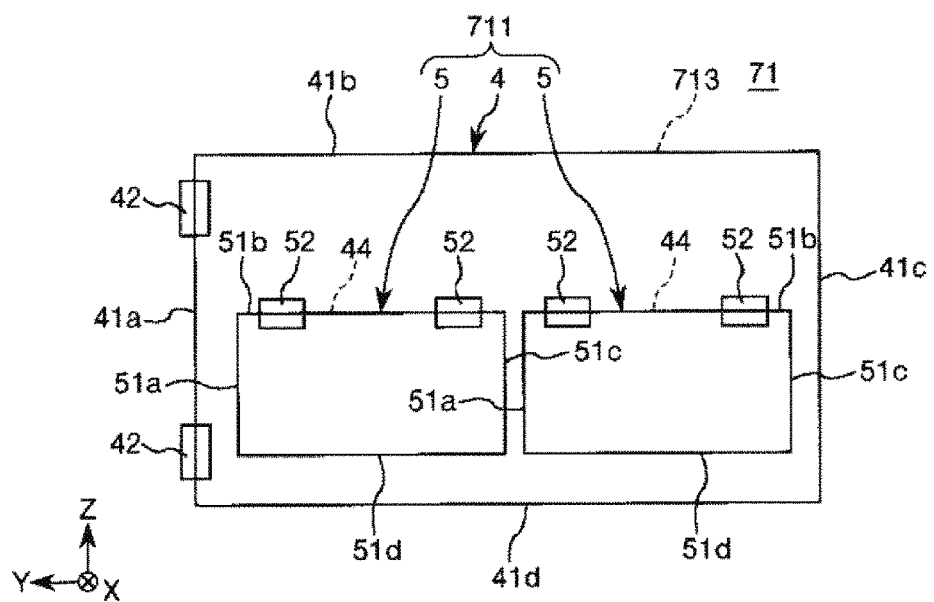
FIG. 8 is a view illustrating a first opening and closing portion in a closed state and a second opening and closing portion in a closed state which are provided in an electronic component inspection apparatus (third embodiment) according to the invention.

FIG. 8 is a view illustrating a first opening and closing portion in a closed state and a second opening and closing portion in a closed state which are provided in an electronic component inspection apparatus (third embodiment) according to the invention.

Hereinafter, the third embodiment of the electronic component transport apparatus and the electronic component inspection apparatus according to the invention will be described with reference to the drawings, but a difference between the embodiment and the above-described embodiments will be focused in the description, and the description of similar parts will be omitted.

The embodiment is similar to the first embodiment except that the number of dispositions of the second opening and closing portion with respect to the first opening and closing portion is different.

As illustrated in FIG. 8, in the first door 711 which is representatively illustrated, two second opening and closing portions 5 are disposed with respect to one first opening and closing portion 4. The two second opening and closing portions 5 are disposed to be aligned along the Y direction. Accordingly, for example, the operator can insert a left hand while the second opening and closing portion 5 on the left side in FIG. 8 is in an open state, and can insert a right hand while the second opening and closing portion 5 on the right side of FIG. 8 is in an open state. In this case, it is possible to use both hands, and thus, workability is improved.

In addition, the number of dispositions of the second opening and closing portion 5 is two in the embodiment, but not being limited thereto, for example, may be three or more.

In addition, the size of the two second opening and closing portions 5 is the same in the embodiment, but not being limited thereto, may be different.

Fourth Embodiment

Figure 9:
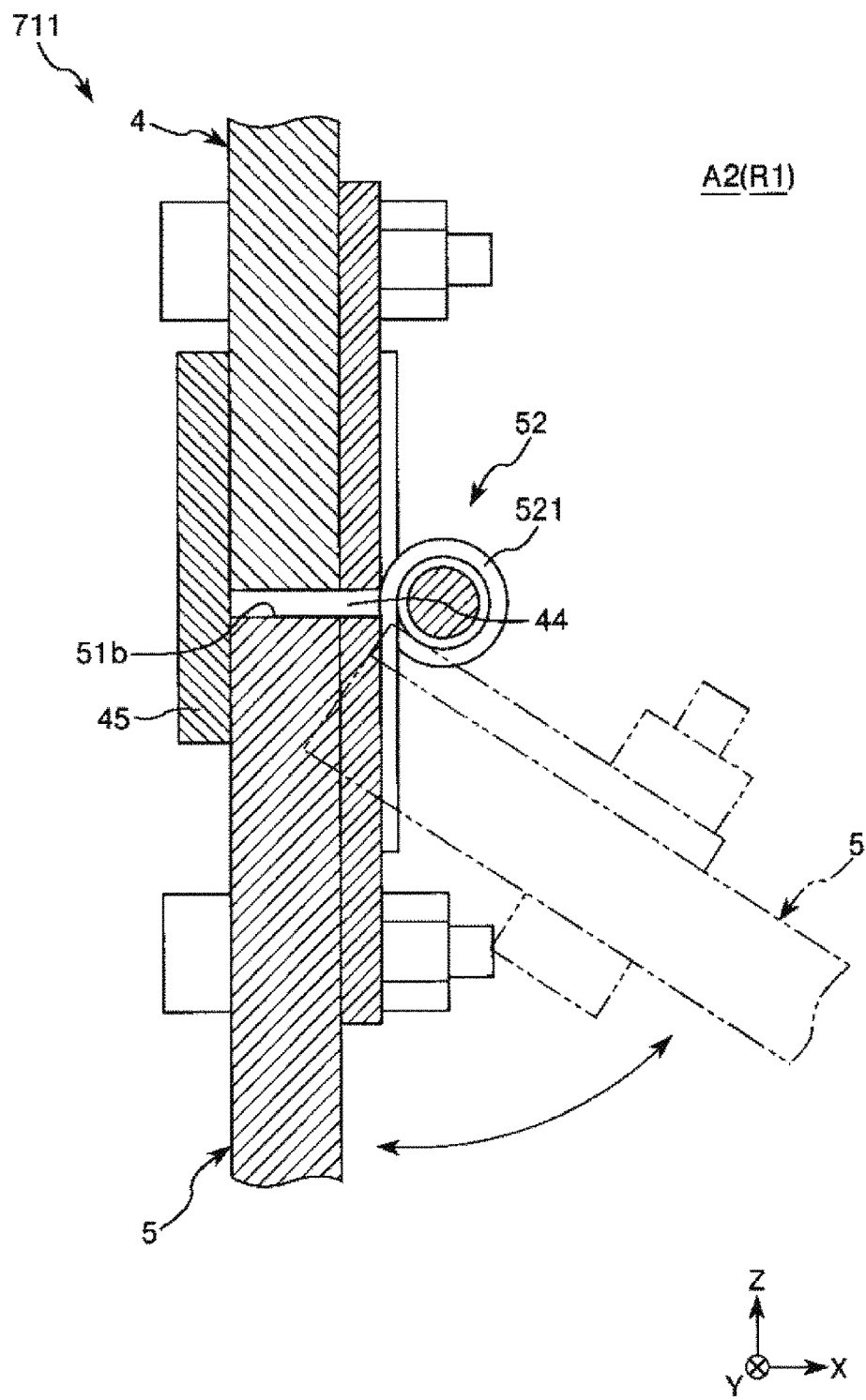
FIG. 9 is a sectional view illustrating a second opening and closing portion in open and closed states provided in an electronic component inspection apparatus (fourth embodiment) according to the invention.

FIG. 9 is a sectional view illustrating a second opening and closing portion in open and closed states provided in an electronic component inspection apparatus (fourth embodiment) according to the invention.

Hereinafter, the fourth embodiment of the electronic component transport apparatus and the electronic component inspection apparatus according to the invention will be described with reference to the drawings, but a difference between the embodiment and the above-described embodiments will be focused in the description, and the description of similar parts will be omitted.

The embodiment is similar to the first embodiment except that the opening and closing direction of the second opening and closing portion is different.

As illustrated in FIG. 9, in the first door 711 which is representatively illustrated, the second opening and closing portions 5 is configured to be open toward the inside of the inspection apparatus 1, that is, toward the device supply region A2 side. The configuration is possible by disposing the second rotation support portion 52 on the device supply region A2 side.

The second opening and closing portion 5 of a so-called "inward opening" is firmly pressed to the plate piece 45 of the first opening and closing portion 4, for example, in a case where the pressure in the device supply region A2 becomes higher than an atmospheric pressure. Accordingly, air tightness in the device supply region A2 is improved.

Fifth Embodiment

Figure 10A:
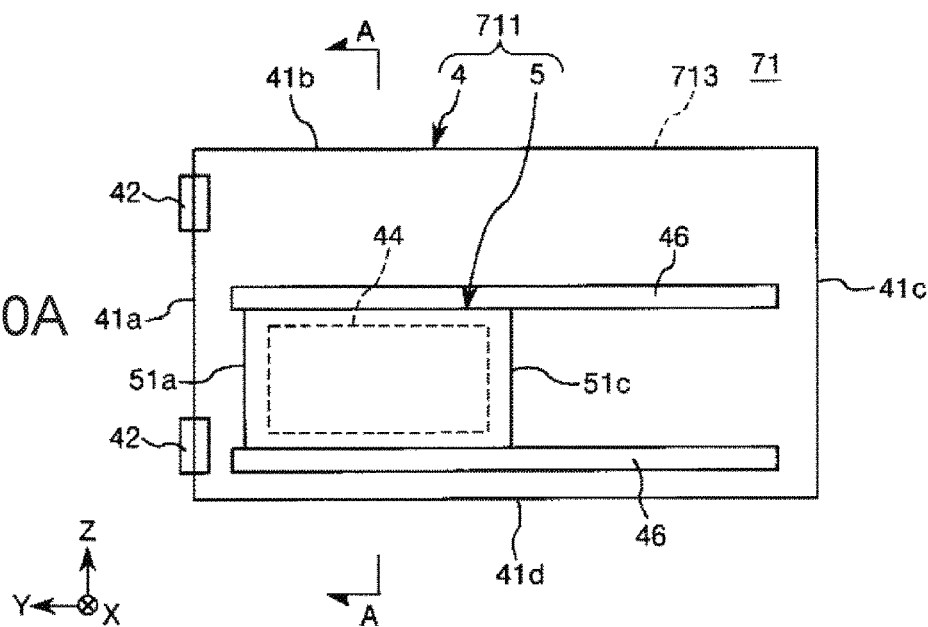
FIGS. 10A and 10B illustrate views illustrating a second opening and closing portion in open and closed states provided in an electronic component inspection apparatus (fifth embodiment) according to the invention.
Figure 10B:
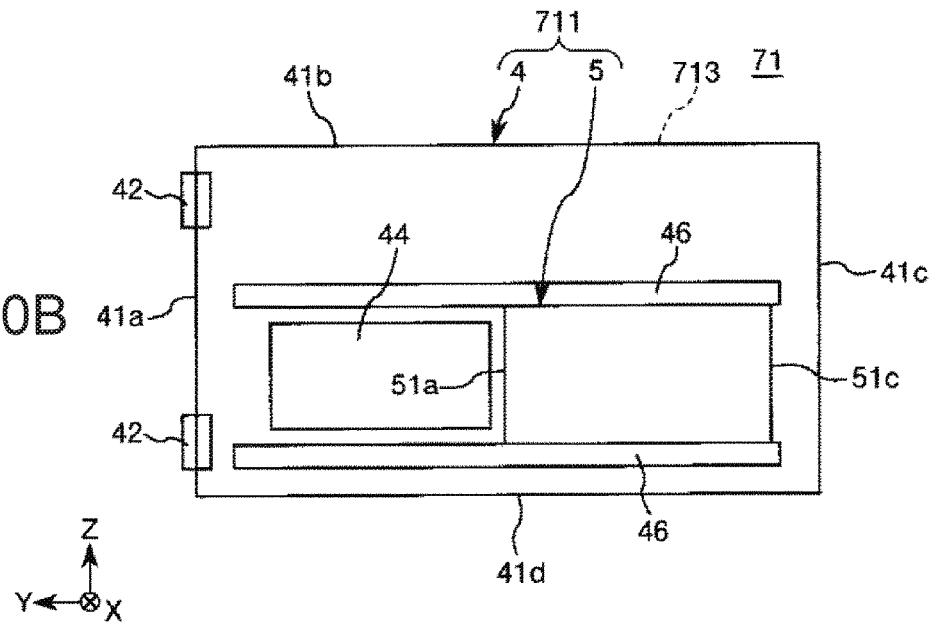
Figure 11:
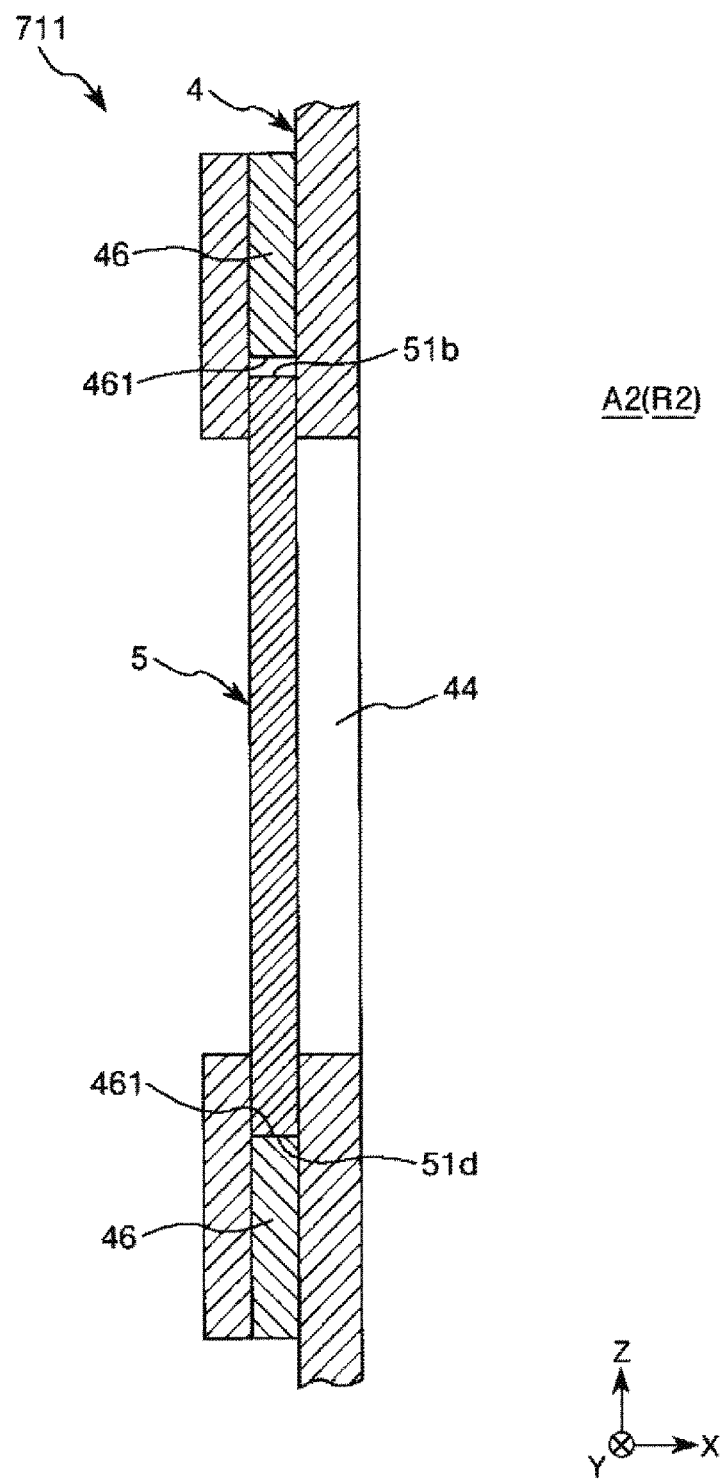
FIG. 11 is a sectional view taken along line A-A in FIG. 10A.

FIGS. 10A and 10B illustrate views illustrating a second opening and closing portion in open and closed states provided in an electronic component inspection apparatus (fifth embodiment) according to the invention. FIG. 11 is a sectional view taken along line A-A in FIG. 10A.

Hereinafter, the fifth embodiment of the electronic component transport apparatus and the electronic component inspection apparatus according to the invention will be described with reference to the drawings, but a difference between the embodiment and the above-described embodiments will be focused in the description, and the description of similar parts will be omitted.

The embodiment is similar to the first embodiment except that the opening and closing direction of the second opening and closing portion is different.

As illustrated in FIGS. 10A and 10B, in the first door 711 which is representatively illustrated, the second opening and closing portion 5 is configured to be open and closed in the Y direction. The configuration is possible as two rails 46 which extend in the Y direction are provided in the first opening and closing portion 4. One rail 46 of the two rails 46 is disposed on the upper side of the second opening and closing portion 5, and the other rail 46 is disposed on the lower side of the second opening and closing portion 5. In addition, as illustrated in FIG. 11, in each of the rails 46, a groove 461 which is formed along the extending direction is provided. In addition, the side 51*b* side of the second opening and closing portion 5 is inserted into the groove 461 of one of the rails 46, and the side 51*d* side of the second opening and closing portion 5 is inserted into the groove 461 of the other one of the rails 46. Accordingly, the second opening and closing portion 5 is supported to be slidable on each of the rails 46, and thus, can be smoothly open and closed.

The second opening and closing portion 5 having the configuration is different from the second opening and closing portion 5 of the first embodiment, and protrudes to the outside of the inspection apparatus 1 in an open state, and an outer shape of the inspection apparatus 1 can be prevented from temporarily increasing.

In addition, in each of the rails 46, it is preferable that a stopper that prevents the second opening and closing portion 5 from being separated at a destination is provided.

In addition, similar to the second opening and closing portion 5, the first opening and closing portion 4 may also be configured to be supported to be slidable.

Sixth Embodiment

Figure 12A:
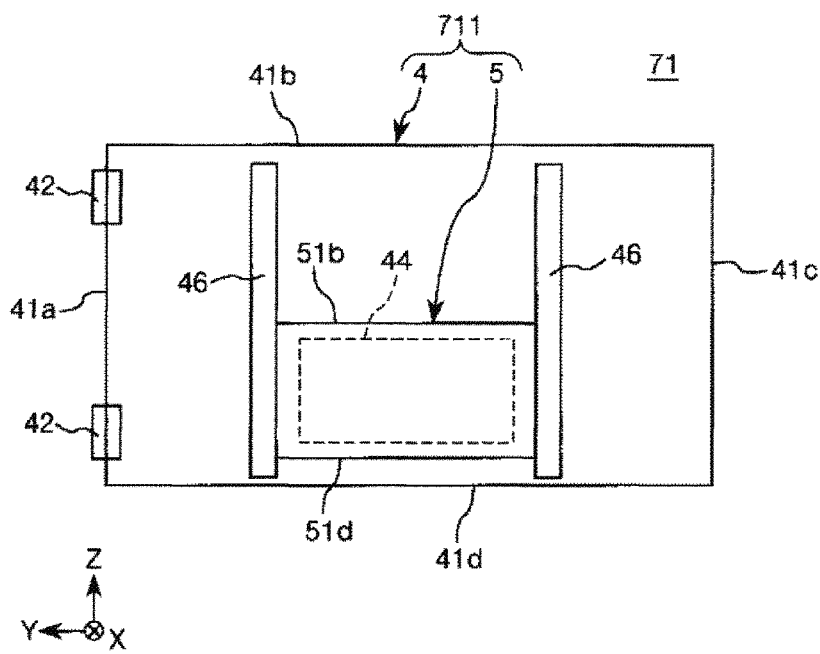
FIGS. 12A and 12B illustrate views illustrating a second opening and closing portion in open and closed states provided in an electronic component inspection apparatus (sixth embodiment) according to the invention.
Figure 12B:
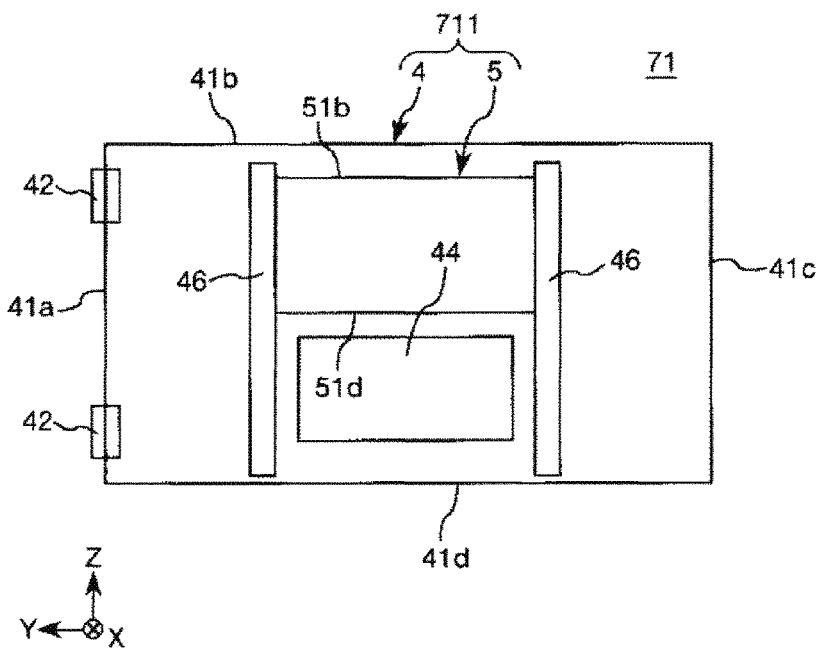

FIGS. 12A and 12B illustrate views illustrating a second opening and closing portion in open and closed states provided in an electronic component inspection apparatus (sixth embodiment) according to the invention.

Hereinafter, the sixth embodiment of the electronic component transport apparatus and the electronic component inspection apparatus according to the invention will be described with reference to the drawings, but a difference between the embodiment and the above-described embodiments will be focused in the description, and the description of similar parts will be omitted.

The embodiment is similar to the fifth embodiment except that the opening and closing direction of the second opening and closing portion is different.

As illustrated in FIGS. 12A and 12B, in the first door 711 which is representatively illustrated, the second opening and closing portions 5 is supported by the two rails 46 which extend in the Z direction, and can be open and closed in the same direction. The configuration is efficient in a case where the second opening and closing portion 5 is desired to be open and closed in the upward-and-downward direction.

In addition, when the second opening and closing portion 5 moves upward and becomes in an open state, it is preferable that a fixing member, such as a knurled screw, which temporarily fixes the second opening and closing portion 5 at the position is provided.

Seventh Embodiment

Figure 13A:
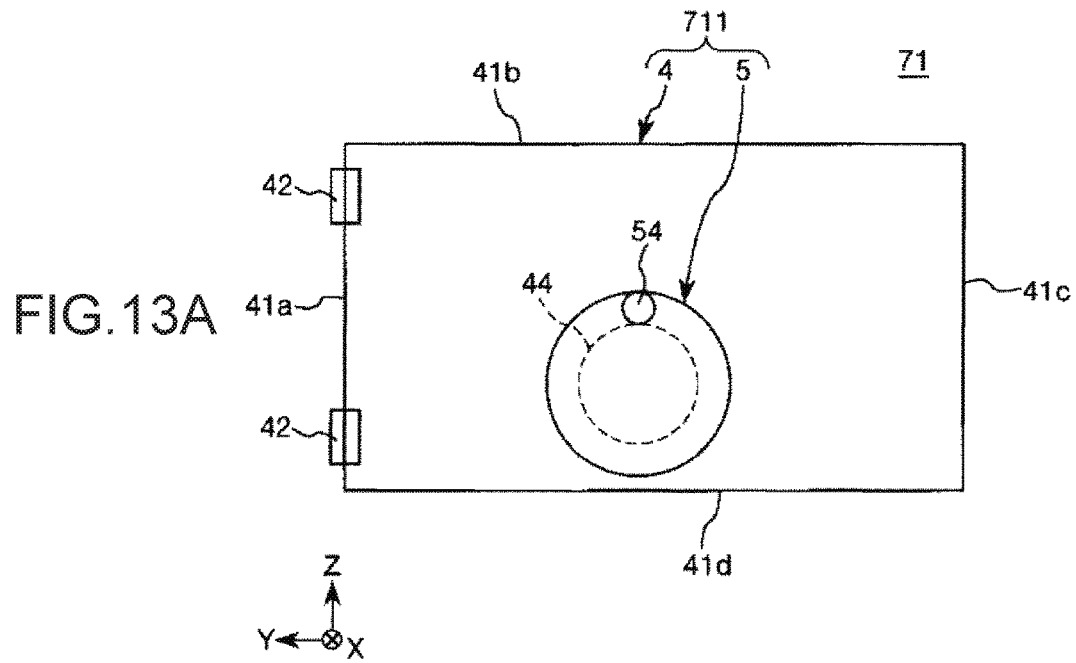
FIGS. 13A and 13B illustrate views illustrating a second opening and closing portion in open and closed states provided in an electronic component inspection apparatus (seventh embodiment) according to the invention.
Figure 13B:
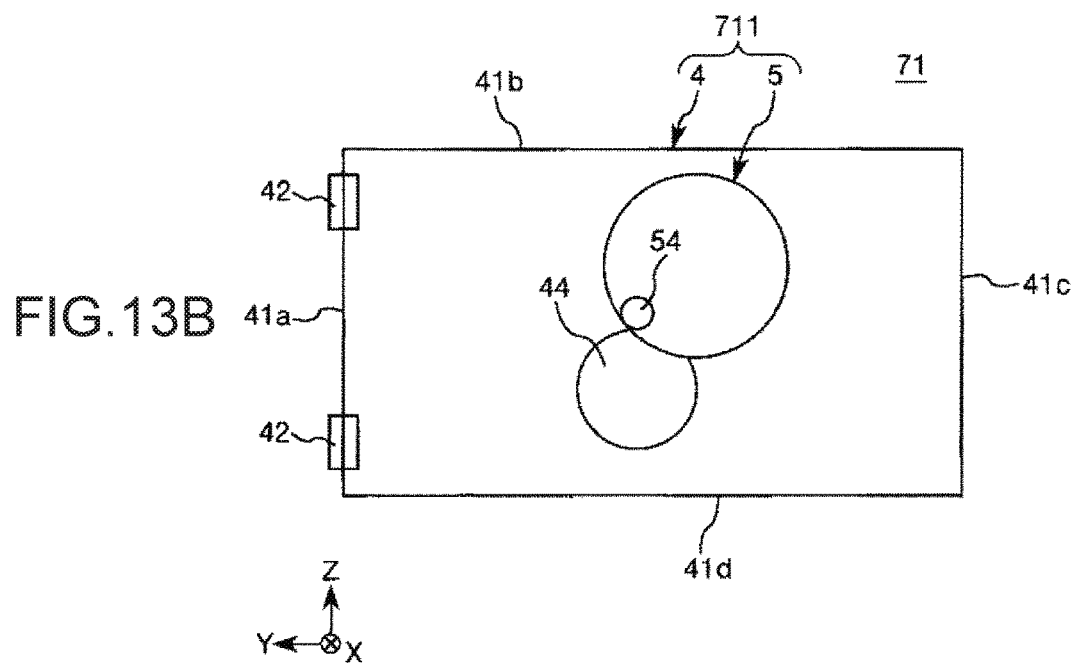

FIGS. 13A and 13B illustrate views illustrating a second opening and closing portion in open and closed states provided in an electronic component inspection apparatus (seventh embodiment) according to the invention.

Hereinafter, the seventh embodiment of the electronic component transport apparatus and the electronic component inspection apparatus according to the invention will be described with reference to the drawings, but a difference between the embodiment and the above-described embodiments will be focused in the description, and the description of similar parts will be omitted.

The embodiment is similar to the first embodiment except that the shape and the opening and closing direction of the second opening and closing portion are different.

As illustrated in FIGS. 13A and 13B, in the first door 711 which is representatively illustrated, the second opening and closing portions 5 is configured of a plate member which makes a substantially circular shape in a plan view. In addition, the opening portion 44 of the first opening and closing portion 4 also makes a circular shape corresponding to the shape of the second opening and closing portion 5.

In addition, the second opening and closing portion 5 is supported to be rotatable around a knurled screw 54 by the knurled screw 54 disposed at the upper part of the opening portion 44 of the first opening and closing portion 4. Accordingly, the second opening and closing portion 5 can be open and closed on the surface of the first opening and closing portion 4. In addition, when the second opening and closing portion 5 is in an open state, it is possible to temporarily fix the second opening and closing portion 5 at the position by fastening the knurled screw 54.

The second opening and closing portion 5 having the configuration is different from the second opening and closing portion 5 in the first embodiment, protrudes to the outside of the inspection apparatus 1 in an open state, and the outer shape of the inspection apparatus 1 can be prevented from temporarily increasing.

Above, the electronic component transport apparatus and the electronic component inspection apparatus according to the invention are described based on the embodiments illustrated in the drawings, but the invention is not limited thereto, and each portion that configures the electronic component transport apparatus and the electronic component inspection apparatus can be replaced with an arbitrary configuration that can achieve similar functions. In addition, arbitrary configuration elements may be added.

In addition, the electronic component transport apparatus and the electronic component inspection apparatus according to the invention may be achieved by combining two or more of arbitrary configurations (characteristics) in each of the embodiments.

In addition, the electronic component transport apparatus and the electronic component inspection apparatus according to the invention may be configured to respectively display the open and closed states of the first opening and closing portion and the second opening and closing portion.

In addition, an elastic film may adhere to the opening portion of the first opening and closing portion which is covered with the second opening and closing portion in the closed state. In this case, in the elastic film, a slit may be provided, or a globe may be provided.

In addition, the detection of the opening and closing of the first opening and closing portion and the detection of the opening and closing of the second opening and closing portion may be performed by one detection portion. In other words, one detection portion may perform both of the detection of the opening and closing of the first opening and closing portion and the opening and closing of the second opening and closing portion.

Eighth Embodiment

Figure 14:
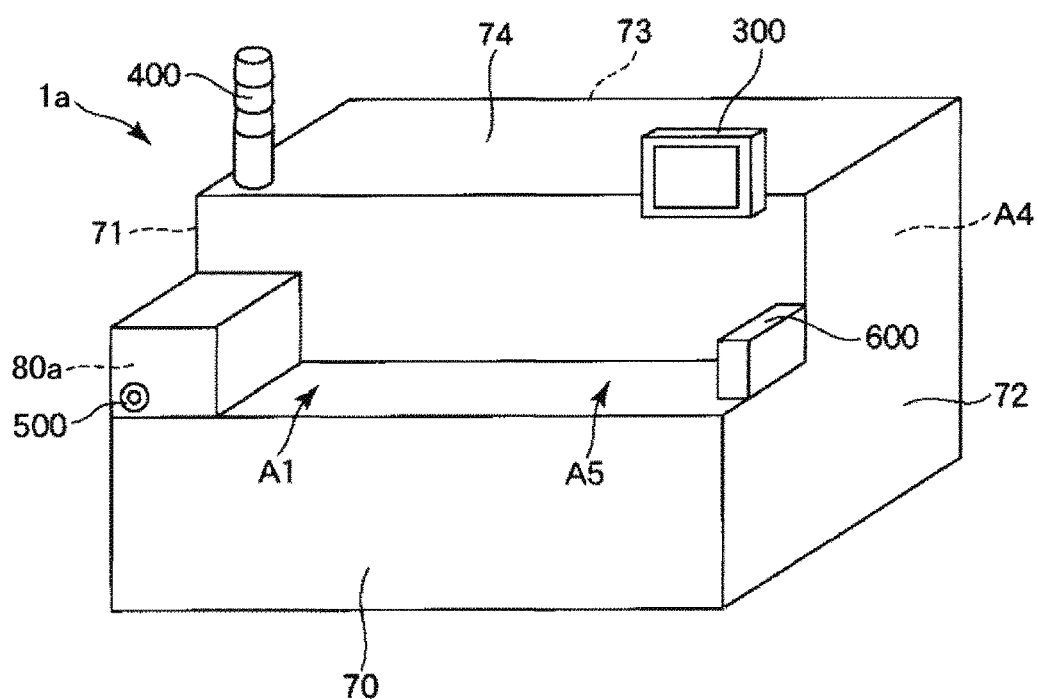
FIG. 14 is a schematic perspective view when an eighth embodiment of an electronic component inspection apparatus according to the invention is viewed from a front side.
Figure 15:
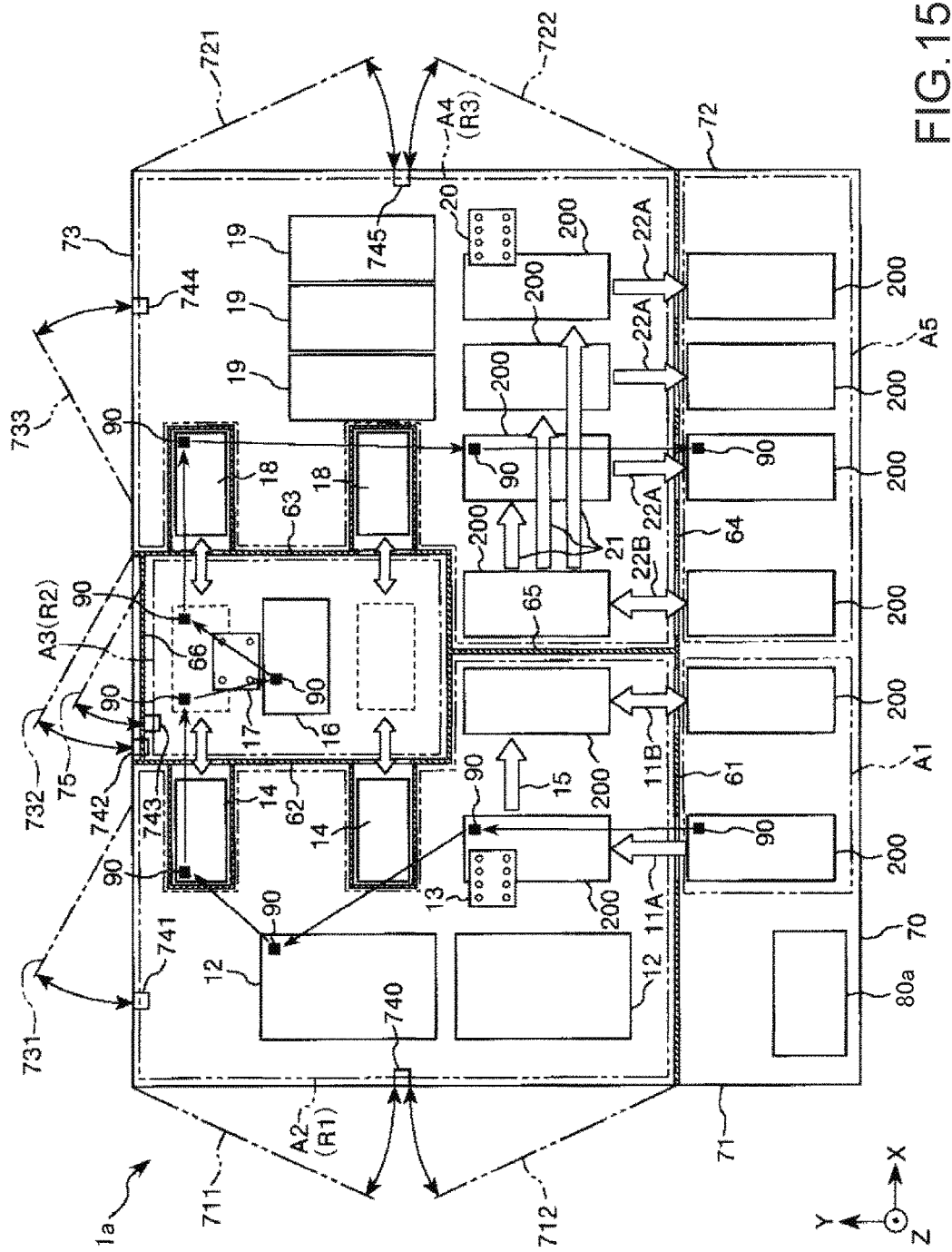
FIG. 15 is a schematic plan view of the electronic component inspection apparatus illustrated in FIG. 14.
Figure 16:
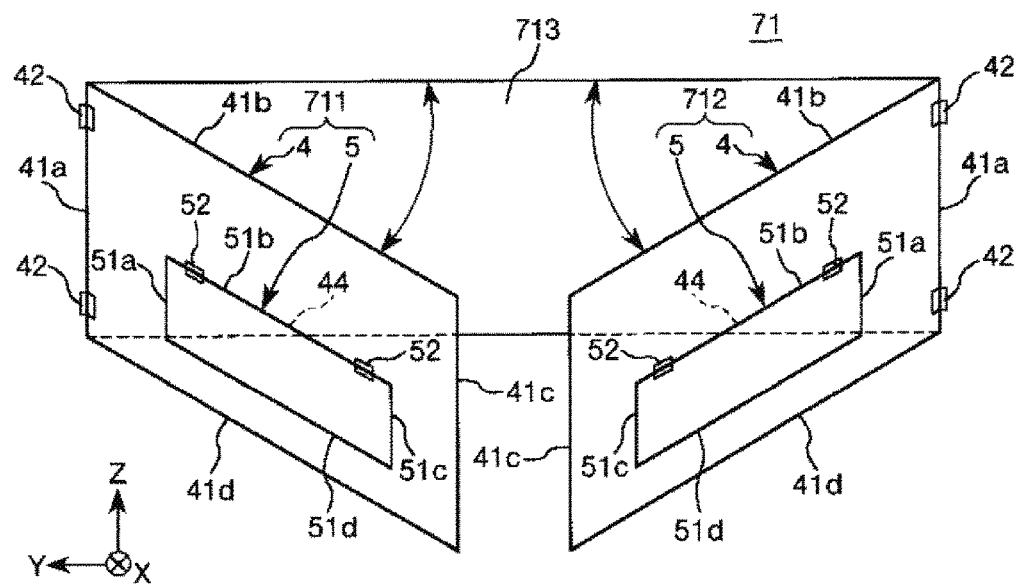
FIG. 16 is a view illustrating a first opening and closing portion in an open state and the second opening and closing portion in a closed state which are provided in the electronic component inspection apparatus illustrated in FIG. 15.
Figure 17:
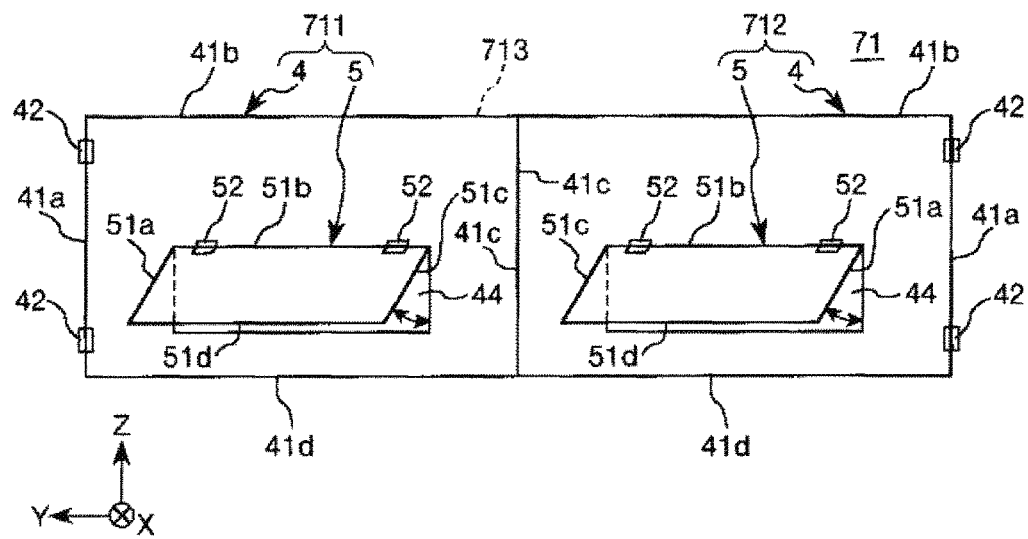
FIG. 17 is a view illustrating the first opening and closing portion in a closed state and the second opening and closing portion in an open state which are provided in the electronic component inspection apparatus illustrated in FIG. 15.
Figure 18:
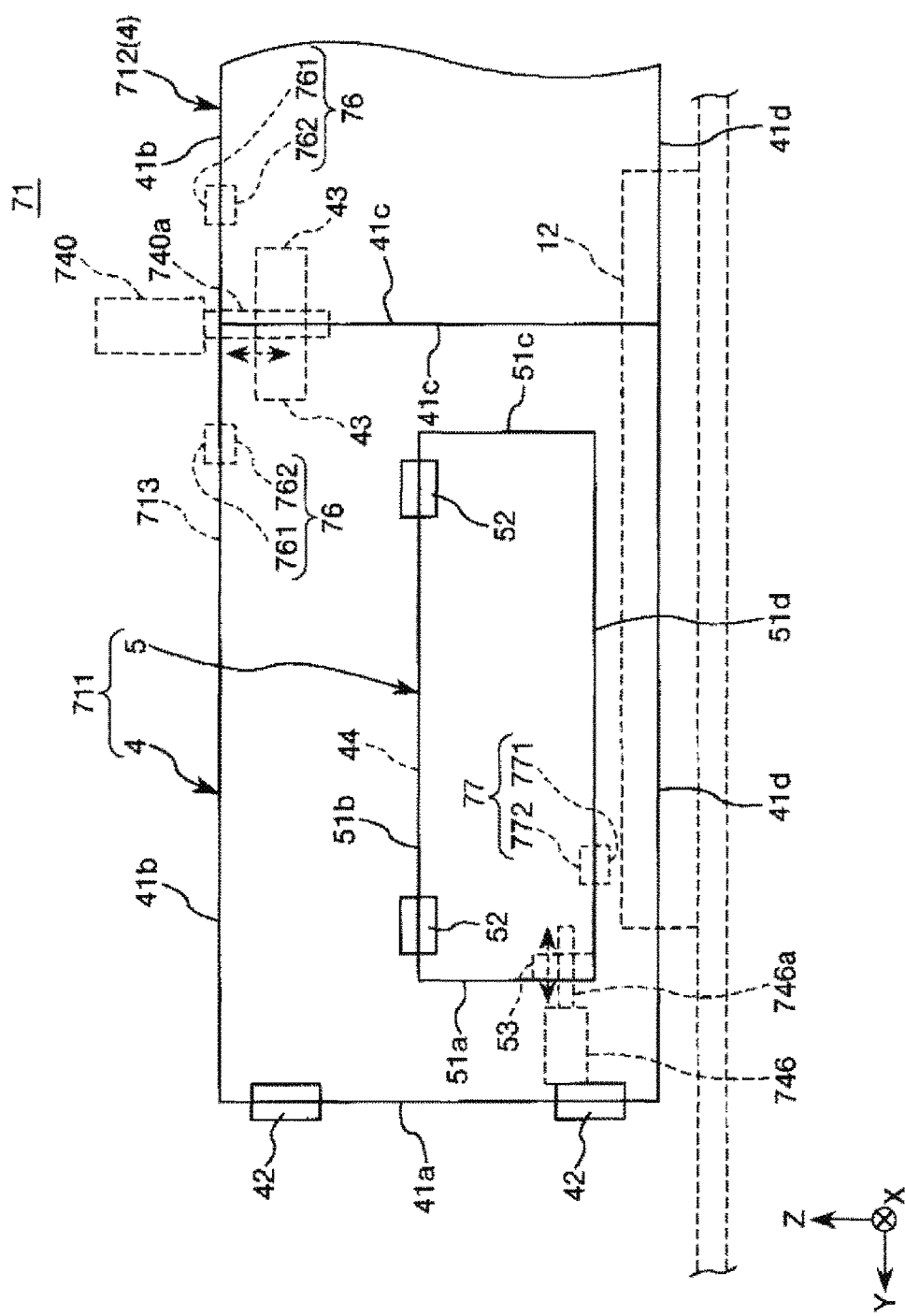
FIG. 18 is a view illustrating the second opening and closing portion provided in the electronic component inspection apparatus illustrated in FIG. 15 and the periphery thereof.
Figure 19:
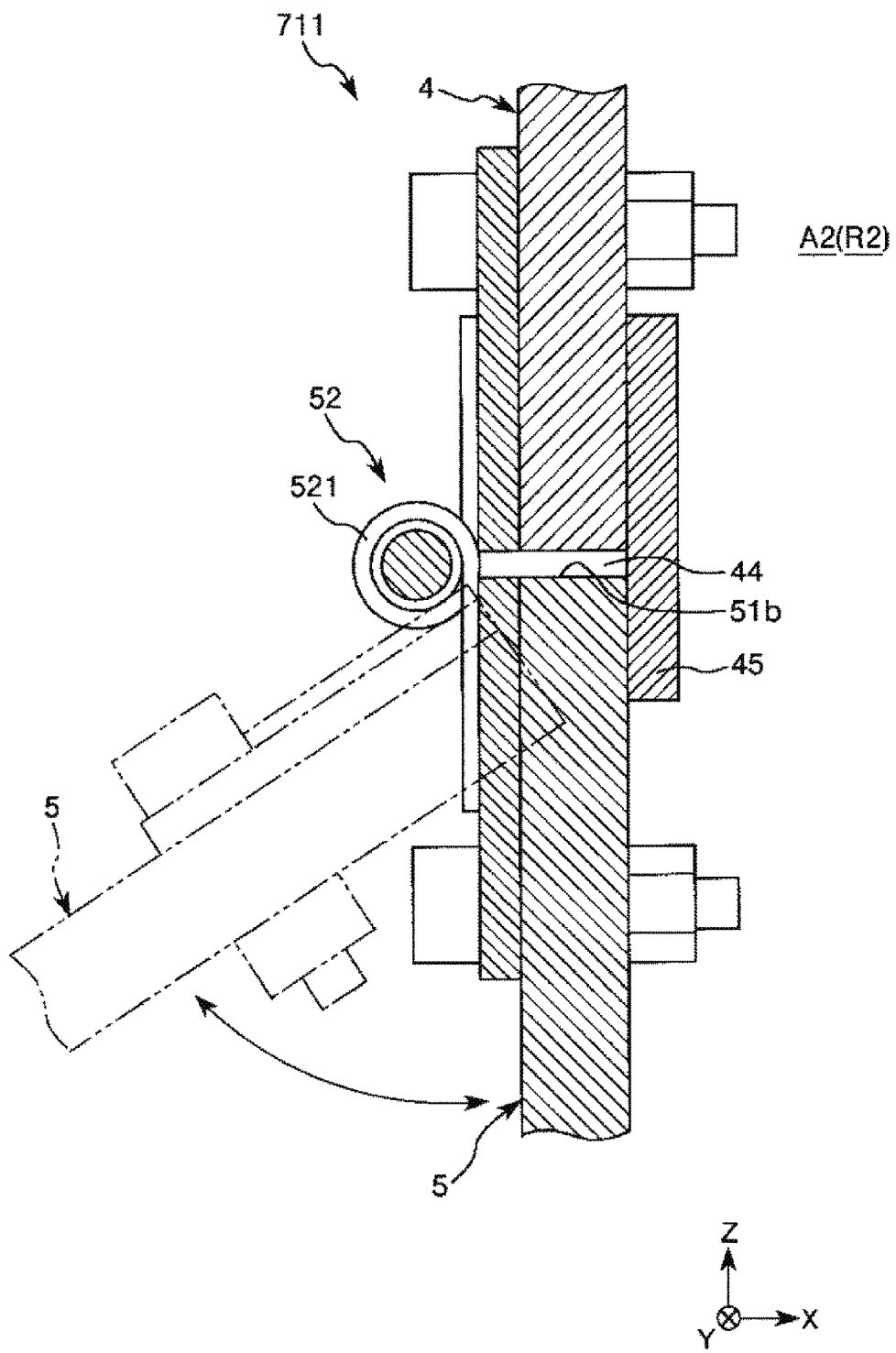
FIG. 19 is a sectional view illustrating the second opening and closing portion in the open and closed states provided in the electronic component inspection apparatus illustrated in FIG. 15.
Figure 20:
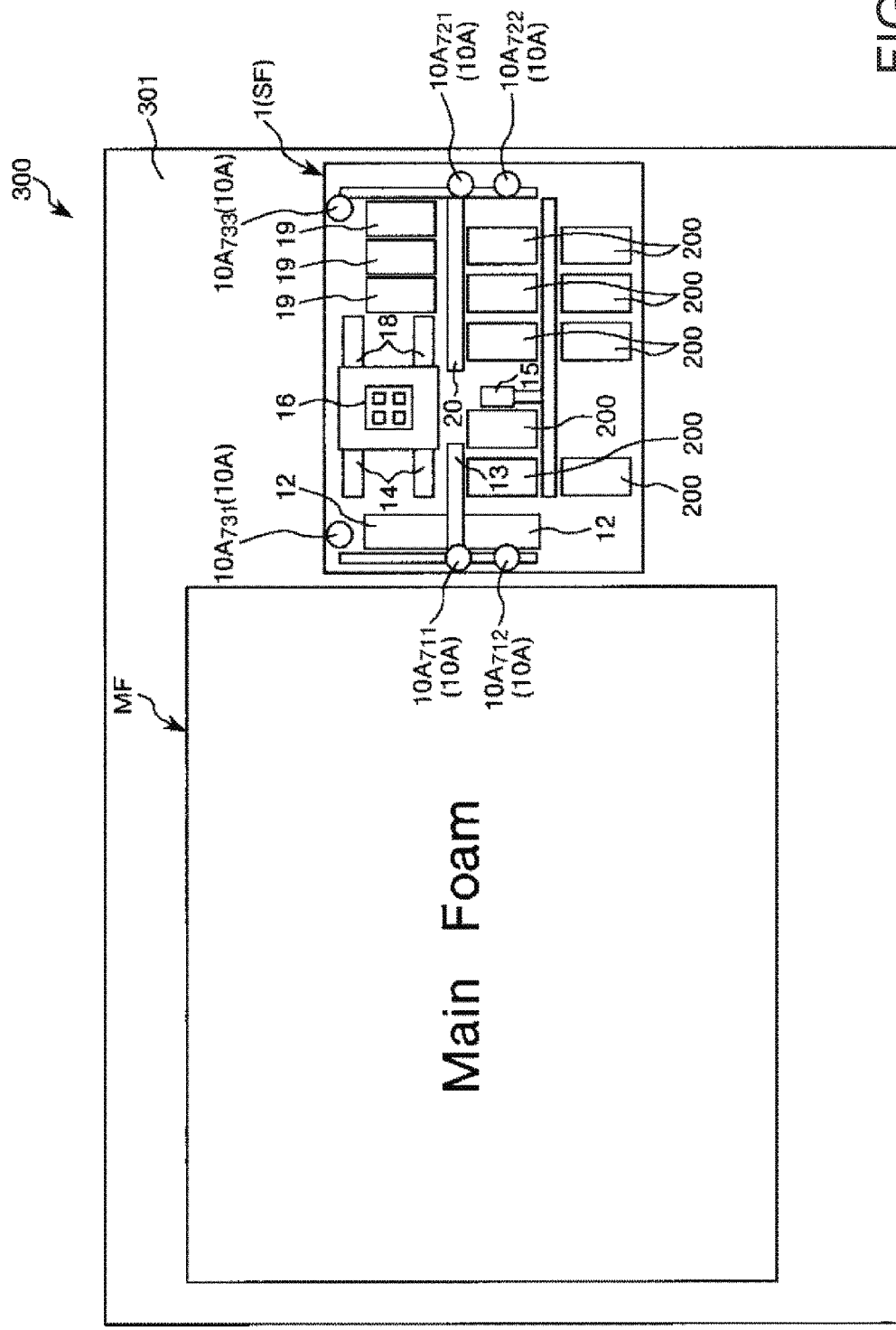
FIG. 20 is an image illustrating the open and closed states of the first opening and closing portion and the second opening and closing portion which are displayed on a monitor provided in the electronic component inspection apparatus illustrated in FIG. 14.
Figure 21:
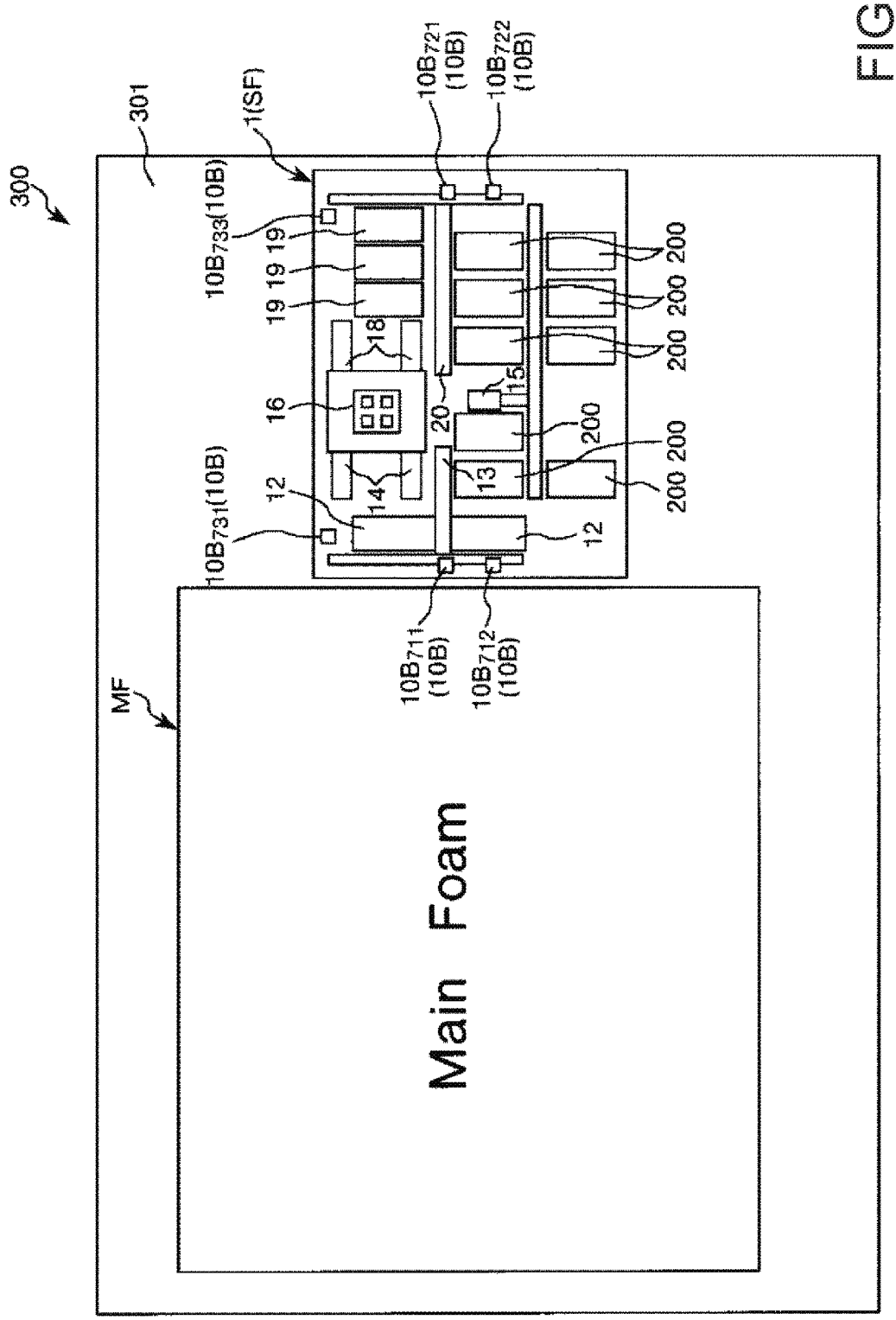
FIG. 21 is an image illustrating the open and closed states of the first opening and closing portion and the second opening and closing portion which are displayed on the monitor provided in the electronic component inspection apparatus illustrated in FIG. 14.
Figure 22:
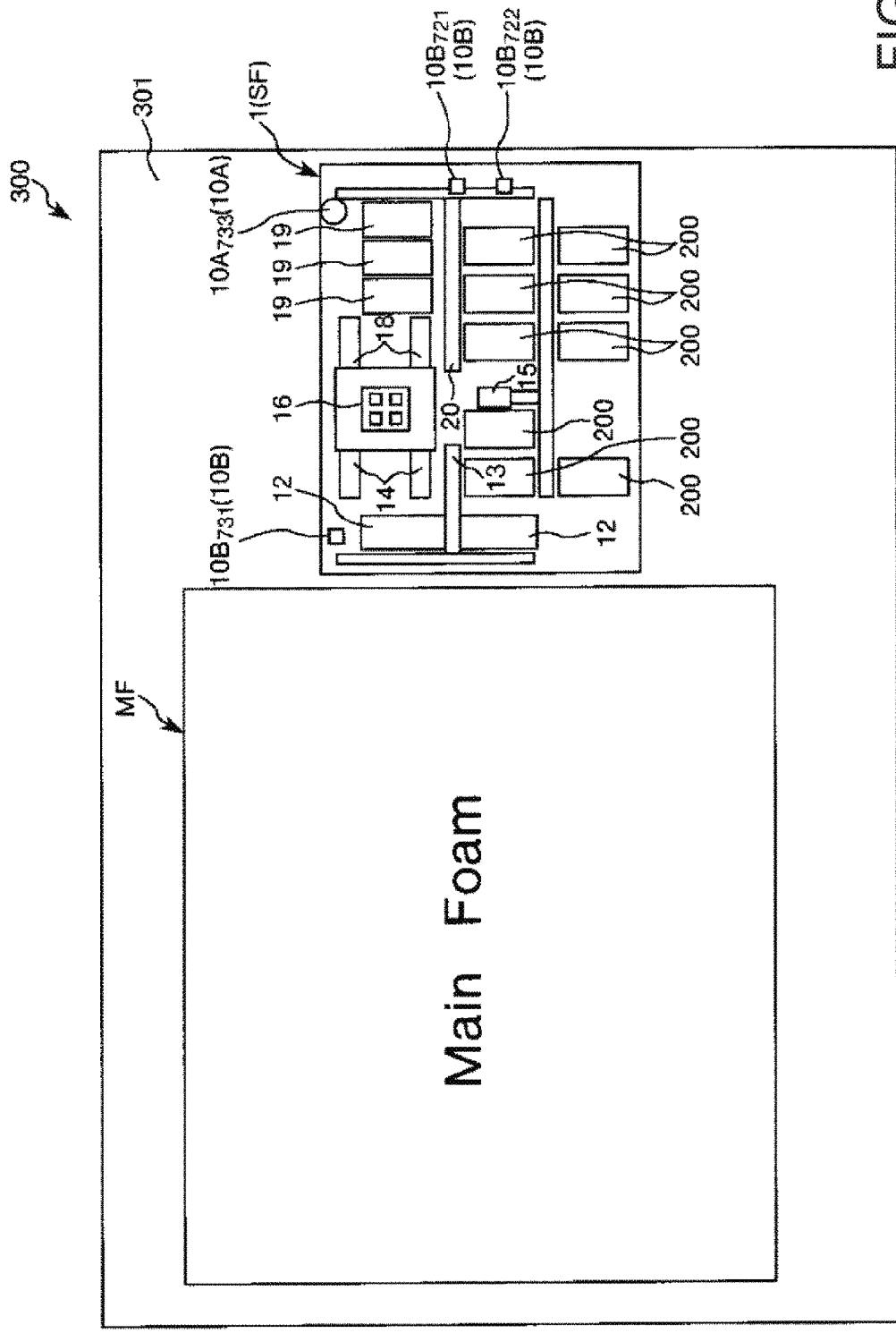
FIG. 22 is an image illustrating the open and closed states of the first opening and closing portion and the second opening and closing portion which are displayed on the monitor provided in the electronic component inspection apparatus illustrated in FIG. 14.
Figure 23:
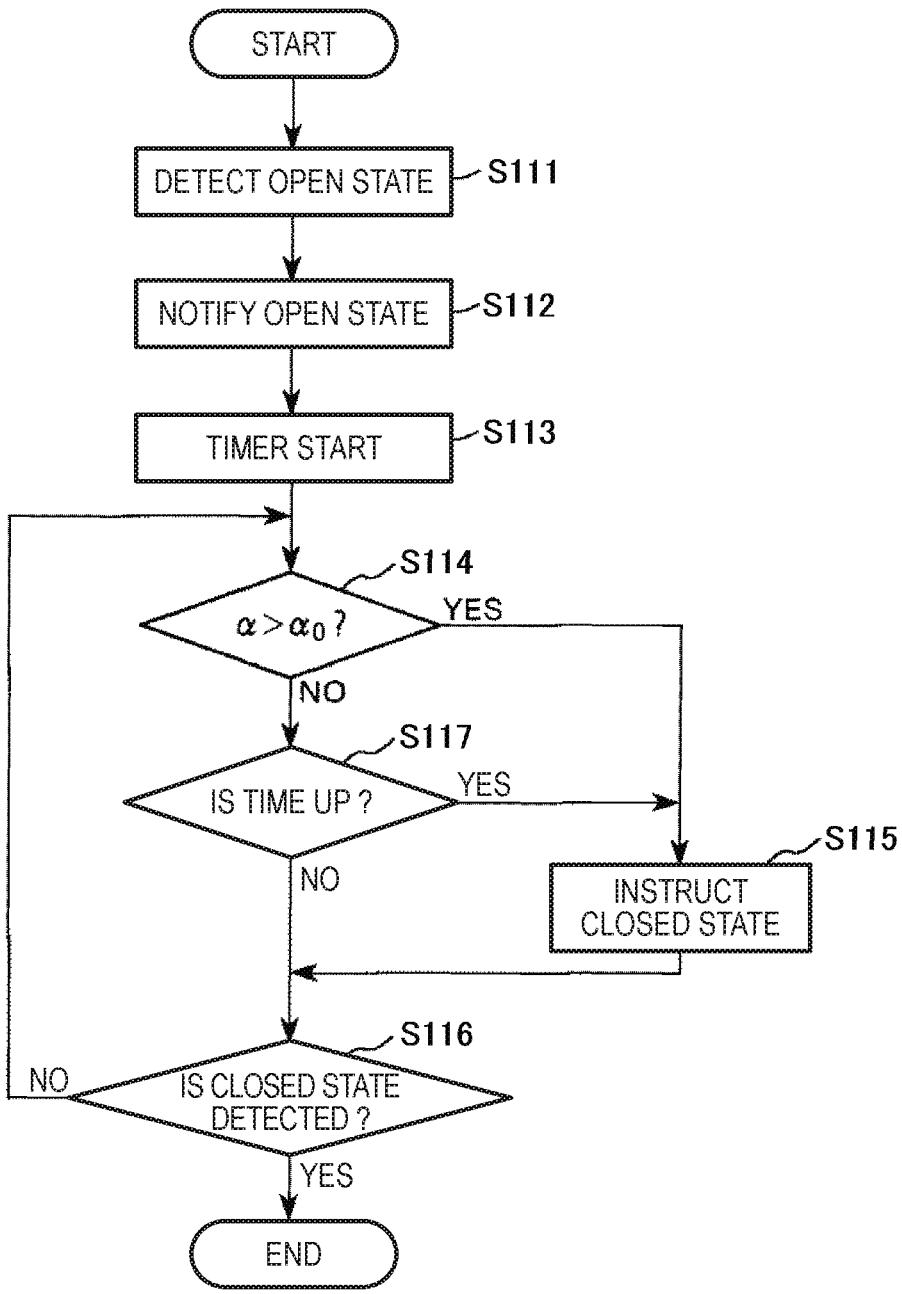
FIG. 23 is a flowchart illustrating a control program in the electronic component inspection apparatus illustrated in FIG. 14.

FIG. 14 is a schematic perspective view when an eighth embodiment of an electronic component inspection apparatus according to the invention is viewed from a front side. FIG. 15 is a schematic plan view of the electronic component inspection apparatus illustrated in FIG. 14. FIG. 16 is a view illustrating a first opening and closing portion in an open state and a second opening and closing portion in a closed state which are provided in the electronic component inspection apparatus illustrated in FIG. 15. FIG. 17 is a view illustrating the first opening and closing portion in a closed state and the second opening and closing portion in an open state which are provided in the electronic component inspection apparatus illustrated in FIG. 15. FIG. 18 is a view illustrating the second opening and closing portion provided in the electronic component inspection apparatus illustrated in FIG. 15 and the periphery thereof. FIG. 19 is a sectional view illustrating the second opening and closing portion in the open and closed states provided in the electronic component inspection apparatus illustrated in FIG. 15. FIGS. 20 to 22 are respectively images illustrating the open and closed states of the first opening and closing portion and the second opening and closing portion which are displayed on a monitor provided in the electronic component inspection apparatus illustrated in FIG. 14. FIG. 23 is a flowchart illustrating a control program in the electronic component inspection apparatus illustrated in FIG. 14.

Hereinafter, the eighth embodiment of the electronic component transport apparatus and the electronic component inspection apparatus according to the invention will be described with reference to the drawings, but a difference between the embodiment and the above-described embodiments will be focused in the description, and the description of similar parts will be given the same reference numerals and omitted.

As illustrated in FIGS. 14 and 15, an inspection apparatus (electronic component inspection apparatus) 1a is divided into the tray supply region A1, the device supply region (hereinafter, also simply called "supply region") A2, the inspection region A3, the device collection region (hereinafter, also simply called "collection region") A4, and the tray removal region A5. In addition, the IC device 90 is transported from the tray supply region A1 to the tray removal region A5 via the supply region A2, the inspection region A3, and the collection region A4 in order, and is subjected to an inspection at the inspection region A3 in a halfway position.

In this manner, the inspection apparatus 1a includes: the electronic component transport apparatus which transports the IC device 90 in the tray supply region A1, the supply region A2, the inspection region A3, the collection region A4, and the tray removal region A5; the inspection portion 16 which performs the inspection in the inspection region A3; and a control portion 80a. In addition to this, the inspection apparatus 1a includes a monitor 300 and a signal lamp 400.

The control portion 80a includes, for example, a driving control portion. The driving control portion controls, for example, the driving of each moving portion of the tray transport mechanisms 11A and 11B, the temperature adjustment portion 12, the device transport head 13, the device supply portion 14, the tray transport mechanism 15, the inspection portion 16, the device transport head 17, the device collection portion 18, the device transport head 20, the tray transport mechanism 21, and the tray transport mechanisms 22A and 22B.

The operator can set or confirm a temperature condition or the like during the operation of the inspection apparatus 1a via the monitor 300.

As illustrated in FIG. 14, the monitor 300 is disposed at the upper part on the front side of the inspection apparatus 1a. In addition, on the +X direction side of the tray removal region A5, a mouse pad 600 on which a mouse to be used when operating the screen displayed on the monitor 300 is placed is provided.

In addition, the signal lamp 400 can notify an operation state or the like of the inspection apparatus 1a by combining colors that generate light. The signal lamp 400 is disposed on a top cover 74. In addition, in the inspection apparatus 1a, a speaker 500 is embedded, and it is possible to notify the operation state or the like of the inspection apparatus 1a according to the speaker 500.

As illustrated in FIG. 15, in the inspection apparatus 1a, a space between the tray supply region A1 and the device supply region A2 is divided (partitioned) by the first partition wall 61, a space between the supply region A2 and the inspection region A3 is divided by the second partition wall 62, a space between the inspection region A3 and the collection region A4 is divided by the third partition wall 63, and a space between the collection region A4 and the tray removal region A5 is divided by the fourth partition wall 64. In addition, a space between the supply region A2 and the collection region A4 is also divided by the fifth partition wall 65. The partition walls have a function of holding air tightness of each of the regions. Furthermore, in the inspection apparatus 1a, the outermost part is covered with a cover, and the cover includes, for example, the front cover 70, the side covers 71 and 72, and the rear cover 73.

In addition, the supply region A2 is the first room R1 which is defined by the first partition wall 61, the second partition wall 62, the fifth partition wall 65, the side cover 71, and the rear cover 73. In the first room R1, the plurality of IC devices 90 in an uninspected state are transported in for each of the trays 200.

The inspection region A3 is the second room R2 which is defined by the second partition wall 62, the third partition wall 63, and the rear cover 73. In addition, in the second room R2, an inner partition wall 66 is disposed further on the inside than the rear cover 73.

The collection region A4 is the third room R3 which is defined by the third partition wall 63, the fourth partition wall 64, the fifth partition wall 65, the side cover 72, and the rear cover 73. In the third room R3, the plurality of IC devices 90 to which the inspection is finished are transported in from the second room R2.

As illustrated in FIG. 15, in the side cover 71, the first door (the first door on the left side) 711 and the second door (the second door on the left side) 712 are provided. By opening the first door 711 or the second door 712, for example, it is possible to perform maintenance or releasing or the like of a jammed state in the IC device 90 (hereinafter, these are referred to as "work" as a total term) in the first room R1. In addition, the first door 711 and the second door 712 are a so-called "hinged double door" which is open and closed in directions opposite to each other.

Similarly, in the side cover 72, the first door (the first door on the right side) 721 and the second door (the second door on the right side) 722 are provided. By opening the first door 721 or the second door 722, for example, it is possible to perform work in the third room R3. In addition, the first door 721 and the second door 722 are also a so-called "hinged double door" which is open and closed in directions opposite to each other.

In addition, in the rear cover 73, the first door (the first door on the rear side) 731, the second door (the second door on the rear side) 732, and the third door (the third door on the rear side) 733 are provided. By opening the first door 731, for example, it is possible to perform work in the first room R1. By opening the third door 733, for example, it is possible to perform work in the third room R3. Furthermore, in the inner partition wall 66, the fourth door 75 is provided. In addition, by opening the second door 732 and the fourth door 75, for example, it is possible to perform work in the second room R2. In addition, the first door 731, the second door 732, and the fourth door 75 are open and closed in the same direction, and the third door 733 is open and closed in the direction opposite to the doors.

In addition, by closing each of the doors, it is possible to ensure air tightness or heat insulating properties in each of the corresponding rooms.

However, in the inspection apparatus 1a, among the doors, the first door 711 and the second door 712 on the side cover 71 side, the first door 721 and the second door 722 on the side cover 72 side, and the first door 731 and the third door 733 on the rear cover 73 side, are respectively configured of the first opening and closing portion 4 and the second opening and closing portion 5 (refer to FIGS. 16 and 17), and are made as an assembly made by assembling these. Hereinafter, the first door 711 which is on the side cover 71 side will be described as a representative example. In addition, the second door 732 and the fourth door 75 have the same structure as that of the first opening and closing portion 4 (the opening portion 44 is omitted).

As illustrated in FIGS. 16 to 18, the first opening and closing portion 4 is a door which is openable and closable with respect to the opening portion 713 formed in the side cover 71. Accordingly, the first opening and closing portion 4 can cover a half (a part on a left side in the drawing) of the opening portion 713 in a closed state (refer to FIG. 17), and can open the opening portion 713 in an open state (refer to FIG. 16).

The first opening and closing portion 4 is configured of a plate member which makes a substantially rectangular shape in a plan view. In addition, the size of the first opening and closing portion 4 depends on the size of the inspection apparatus 1a, but for example, any of the longitudinal length (length in the Z direction) and the horizontal length (length in the Y direction) is preferably from 400 mm to 600 mm, and is more preferably from 450 mm to 550 mm.

In addition, in the first opening and closing portion 4 which makes a rectangular shape, the side 41a which extends in the perpendicular direction among four sides (edge portions) 41a, 41b, 41c, and 41d is linked to the side cover 71 by two first rotation support portions 42. The two first rotation support portions 42 are disposed to be separated from each other in the Z direction. In addition, each of the first rotation support portions 42 is configured of a hinge which supports the first opening and closing portion 4 to be rotatable. Accordingly, it is possible to support the first opening and closing portion 4 using an axis parallel to the perpendicular direction, that is, the Z direction, as a rotation axis to be rotatable, and to smoothly perform the opening and closing thereof.

As illustrated in FIG. 18, the cylinder 740 which functions as a first locking mechanism (locking portion) that maintains a state where the first opening and closing portion 4 is closed is disposed in the vicinity (for example, 0 mm to 50 mm) of an upper part of the opening portion 713 of the side cover 71, and is fixed. In the cylinder 740, the cylinder rod 740a freely protrudes. In addition, when the cylinder rod 740a protrudes downward, the cylinder rod 740a can be engaged with the locking member 43 provided in the first opening and closing portion 4 (refer to FIG. 18). Accordingly, the closed state of the first opening and closing portion 4 is maintained, and for example, it is possible to prevent the first opening and closing portion 4 from being open mistakenly by an operator while the IC device 90 is transported.

In addition, in the embodiment, the cylinder 740 can maintain the closed state of the first opening and closing portion 4 of the second door 712 regardless of maintaining the closed state of the first opening and closing portion 4 of the first door 711. In other words, in the cylinder 740, the cylinder rod 740a can be collectively engaged with the locking member 43 of the first opening and closing portion 4 of the first door 711, and the locking member 43 of the first opening and closing portion 4 of the second door 712, and thus, it is possible to collectively maintain the closed state of the first opening and closing portions 4 of the doors.

Similarly, on the side cover 72 side, the cylinder 745 can collectively maintain the closed state of the first door 721 and the second door 722. In addition, on the rear cover 73 side, the cylinder 741 can maintain the closed state of the first door 731, the cylinder 742 can maintain the closed state of the second door 732, the cylinder 744 can maintain the closed state of the third door 733, and the cylinder 743 can maintain the closed state of the fourth door 75. In addition, operations of the cylinders 740 to 745 are independently performed by using a predetermined switch.

As described above, the door configured of the first opening and closing portion 4 and the second opening and closing portion 5 includes the first door 711 and the second door 712 on the side cover 71 side, the first door 721 and the second door 722 on the side cover 72 side, and the first door 731 and the third door 733 on the rear cover 73 side. Therefore, the number of installations of the first opening and closing portions 4 is the number (plural number) which is the same as the number of the doors. Accordingly, with respect to a part to which the work in the transport region is desired to be performed, when opening the first opening and closing portion 4 as close as possible, it is possible to easily perform the work.

In addition, as illustrated in FIG. 18, the magnet sensor 761 and the magnet 762 which function as the detection portion 76 that detects the opening and closing of the first opening and closing portion 4 are provided. The magnet sensor 761 is disposed in the vicinity (for example, 0 mm to 50 mm) of the upper part of the opening portion 713 of the side cover 71, and is fixed, and is electrically connected to the control portion 80a. When the magnet 762 is fixed to the first opening and closing portion 4 and the first opening and closing portion 4 is in a closed state, the magnet 762 is disposed at a position which is in the vicinity of, that is, which faces the magnet sensor 761. In addition, when performing the work in the first room R1, in a case where the open state of the first opening and closing portion 4 is detected by the detection portion 76, the moving portion of the device transport head 13 or the like in the first room R1 is stopped. Accordingly, it is possible to ensure safety of the operator who performs the work.

As illustrated in FIGS. 16 to 18, in the first opening and closing portion 4, the second opening and closing portion 5 is provided. The second opening and closing portion 5 is a door which is openable and closable with respect to the opening portion 44 formed in the first opening and closing portion 4. Accordingly, the second opening and closing portion 5 can cover the opening portion 44 in a closed state (refer to FIG. 16), and can open the opening portion 44 in an open state (refer to FIG. 17). In addition, the second opening and closing portion 5 is configured of a plate member which makes a substantially rectangular shape in a plan view, and the area is smaller than the area of the first opening and closing portion 4. In addition, in the periphery of the opening portion 44 of the first opening and closing portion 4, the plate piece 45 for a stopper that prevents, when the second opening and closing portion 5 is in a closed state, the second opening and closing portion 5 from being inclined to the device supply region A2 side is provided (refer to FIG. 19). In addition, a packing (sealing material) may be installed in the plate piece 45. Accordingly, it is possible to appropriately hold air tightness between the second opening and closing portion 5 in a closed state and the plate piece 45.

As the second opening and closing portion 5 is provided, for example, when performing the work with respect to the temperature adjustment portion 12 (the inside of the inspection apparatus 1a) in the device supply region A2, while the first opening and closing portion 4 is not in an open state and the second opening and closing portion 5 is in an open state, the work can be performed. Since the open state of the second opening and closing portion 5 is smaller than the open state of the first opening and closing portion 4, it is possible to suppress the inflow of the external air to the inside of the device supply region A2 as much as possible during the work with respect to the temperature adjustment portion 12. Accordingly, a low-temperature environment in the device supply region A2 is held, and thus, it is possible to prevent dew condensation or hoarfrost from being generated in the IC device 90 or the like, and to rapidly perform an operation of the inspection apparatus 1a from a state where the second opening and closing portion 5 is reclosed.

In addition, the size of the second opening and closing portion 5 depends on the size of the first opening and closing portion 4, but for example, the longitudinal length (length in the Z direction) is preferably from 150 mm to 200 mm, and is more preferably from 180 mm to 200 mm, and the horizontal length (length in the Y direction) is preferably from 150 mm to 400 mm, and is more preferably from 200 mm to 360 mm. By the size, it is possible to easily put in and out the arms of adults in general or the tray 200 having a general size, for example, via the second opening and closing portion 5 which is in an open state. In addition, it is possible to prevent the head of the worker from entering via the second opening and closing portion 5 in an open state.

In addition, in the second opening and closing portion 5 which makes a rectangular shape, the side 51b which extends in the horizontal direction among four sides (edge portions) 51a, 51b, 51c, and 51d is linked to the first opening and closing portion 4 by two second rotation support portions 52. The two second rotation support portions 52 are disposed to be separated from each other in the Y direction. In addition, each of the second rotation support portions 52 is configured of a hinge which supports the second opening and closing portion 5 to be rotatable. Accordingly, it is possible to support the second opening and closing portion 5 using an axis parallel to the horizontal direction, that is, the Y direction, as a rotation axis to be rotatable, and to smoothly perform the opening and closing thereof.

In addition, as illustrated in FIG. 19, the hinge which configures the second rotation support portion 52 has the torsion spring 521 embedded therein. The torsion spring 521 functions as a biasing portion that biases the second opening and closing portion 5. Accordingly, the second opening and closing portion 5 is closed by a self load, and in addition to this, the second opening and closing portion 5 can be closed by the biasing force by the torsion spring 521. Accordingly, it is possible to prevent the second opening and closing portion 5 after the work from being left closed.

As illustrated in FIGS. 17 and 19, in the embodiment, the second opening and closing portion 5 opens to the outside of the inspection apparatus 1a. Accordingly, for example, in a case where the second opening and closing portion 5 in an open state is configured to regulate such that the second opening and closing portion 5 becomes perpendicular to the first opening and closing portion 4, it is possible to temporarily place a tool to be used in the work on the second opening and closing portion 5.

In addition, as illustrated in FIG. 18, as a disposition location of the second opening and closing portion 5, the second opening and closing portion 5 is preferably disposed in the vicinity of the temperature adjustment portion 12 in the device supply region A2 and further perpendicularly above the temperature adjustment portion 12. Here, regarding the "vicinity", the distance from the temperature adjustment portion 12 to the second opening and closing portion 5 is preferably approximately the length from the shoulder of adults in general to the fingertip (to the extent that the fingertip can reach in a case of being inserted to the shoulder), that is, 700 mm or shorter, and is more preferably approximately the length from the elbow to the fingertip (to the extent that the fingertip can reach in a case of being inserted to the elbow), that is, 500 mm or shorter. Accordingly, when the second opening and closing portion 5 is in an open state, a state where the temperature adjustment portion 12 is at a position which is lower than a line of sight of the operator who performs the work can be achieved, and thus, it is possible to immediately perform the work with respect to the temperature adjustment portion 12. In addition, by the rapid work, it is possible to shorten the time during which the second opening and closing portion 5 is in an open state as much as possible, and thus, it is possible to suppress the inflow of the external air to the inside of the device supply region A2.

The cylinder 746 which functions as the second locking mechanism (locking portion) that maintains a state where the second opening and closing portion 5 is closed is disposed in the vicinity (for example, 0 mm to 50 mm) of the opening portion 44 of the first opening and closing portion 4, and is fixed. In the cylinder 746, the cylinder rod 746a freely protrudes. In addition, when the cylinder rod 746a protrudes, the cylinder rod 746a can be engaged with the locking member 53 provided in the second opening and closing portion 5 (refer to FIG. 18). Accordingly, the closed state of the second opening and closing portion 5 is maintained, and for example, it is possible to prevent the second opening and closing portion 5 from being open mistakenly by the operator while the IC device 90 is transported. In addition, the operation of the cylinder 746 is performed by using a predetermined switch.

In addition, the magnet sensor 771 and the magnet 772 which function as the detection portion 77 that detects the opening and closing of the second opening and closing portion 5, that is, which can perform sensing, are provided. The magnet sensor 771 is disposed in the vicinity (for example, 0 mm to 50 mm) of the lower part of the opening portion 44 of the first opening and closing portion 4, and is fixed, and is electrically connected to the control portion 80a. When the magnet 772 is fixed to the second opening and closing portion 5 and the second opening and closing portion 5 is in a closed state, the magnet 772 is disposed at a position which is in the vicinity of, that is, which faces the magnet sensor 771. In addition, when performing the work in the first room R1, in a case where the open state of the second opening and closing portion 5 is detected by the detection portion 77, similar to a case where the open state of the first opening and closing portion 4 is detected by the detection portion 76, the moving portion of the device transport head 13 or the like in the first room R1 is also stopped. Accordingly, it is possible to ensure safety of the operator who performs the work.

As described above, the inspection apparatus 1a includes the monitor 300, the signal lamp 400, and the speaker 500. In addition, these are electrically connected to the control portion 80a, and in accordance with the detection result of the opening and closing of the first opening and closing portion 4 by each of the detection portions 76 and the detection result of the opening and closing of the second opening and closing portion 5 by each of the detection portions 77, these members also function as a notification portion which notifies the open and closed states of all of the first opening and closing portions 4 and the second opening and closing portions 5.

The monitor 300 includes a liquid crystal display screen 301, and can notify the open and closed state by the light generation, that is, by combining (color generation) three primary colors of the light.

The signal lamp 400 is configured, for example, to generate the light of three colors (red, green, yellow) independently from each other, and by combining the colors, it is possible to notify the open and closed state.

The speaker 500 can notify the open and closed state by generating an alarm sound, and in addition to this, a voice.

In addition, according to any of the notifications, when performing the work with respect to the inspection apparatus 1a, it is possible to urge the operator to close the first opening and closing portion 4 or the second opening and closing portion 5 which is in an open state as fast as possible by the sense of seeing and hearing. Accordingly, it is possible to shorten the time of being in an open state, and thus, to suppress the inflow of the external air to the inspection apparatus 1a (the transport region) as much as possible.

In addition, in the inspection apparatus 1a, among the notification by the monitor 300, the notification by the signal lamp 400, and the notification by the speaker 500, it is possible to output an appropriate combination of at least two of the notifications. Accordingly, the operator can easily realize the notification.

In addition, in the inspection apparatus 1a, the notification by the monitor 300, the notification by the signal lamp 400, and the notification by the speaker 500 can be used in accordance with the open and closed states of the first opening and closing portion 4 and the open and closed states of the second opening and closing portion 5. For example, as a first notification portion which notifies the open and closed states of the first opening and closing portion 4, the monitor 300 can be used, and as a second notification portion which notifies the open and closed states of the second opening and closing portion 5, the signal lamp 400 can be used. In this manner, in the inspection apparatus 1a, at least one of the monitor 300, the signal lamp 400, and the speaker 500 can be selected and used as the first notification portion, and the rest of the selected monitor 300, the signal lamp 400, and the speaker 500 can be selected and used as the second notification portion. Accordingly, it is possible to perform the setting of the notification which corresponds to the user who uses the inspection apparatus 1a, and thus, operability for the user is improved.

Hereinafter, as an example, a case where the monitor 300 is used as the notification portion will be described.

As illustrated in FIGS. 20 to 22, on the display screen 301, a main form MF and a subform SF which is positioned to be adjacent to the main form MF on the right side in the drawing, are displayed.

In the main form MF, for example, a button or the like for selecting various menus is included.

The subform SF is a schematic view of the inspection apparatus 1a. In addition, in the subform SF, a first notification portion 10A which notifies the open and closed states ("open state" in the embodiment) of each of the first opening and closing portions 4, and a second notification portion 10B which notifies the open and closed states ("open state" in the embodiment) of each of the second opening and closing portions 5, are included.

In addition, when the first opening and closing portion 4 is in a closed state, the display of the first notification portion 10A is suppressed, and when the second opening and closing portion 5 is in a closed state, the display of the second notification portion 10B is suppressed.

In the embodiment, the shapes and the sizes of the first notification portion 10A and the second notification portion 10B are different from each other, and the first notification portion 10A makes a circular shape, and the second notification portion 10B makes a shape of a square that is smaller than the first notification portion 10A. Due to the difference, it is possible to easily grasp that the open and closed states of the first opening and closing portion 4 or the open and closed states of the second opening and closing portion 5 is notified.

In addition, a difference aspect between the first notification portion 10A and the second notification portion 10B is not limited to the difference in shape and size, and for example, a difference only in shape, a difference only in size, and in addition to this, a difference including color and lighting state (a period of lighting, duty ratio or the like), may be considered. In addition, an appropriate combination of the conditions may be employed.

As described above, the door configured of the first opening and closing portion 4 and the second opening and closing portion 5 includes the first door 711 and the second door 712 on the side cover 71 side, the first door 721 and the second door 722 on the side cover 72 side, and the first door 731 and the third door 733 on the rear cover 73 side.

For example, in a case where all of the first opening and closing portions 4 in each of the doors are in an open state, as illustrated in FIG. 20, an open state of the first opening and closing portion 4 of the first door 711 is notified by a first notification portion $10A_{711}$, an open state of the first opening and closing portion 4 of the second door 712 is notified by a first notification portion $10A_{712}$, an open state of the first opening and closing portion 4 of the first door 721 is notified by a first notification portion $10A_{721}$, an open state of the first opening and closing portion 4 of the second door 722 is notified by a first notification portion $10A_{722}$, an open state of the first opening and closing portion 4 of the first door 731 is notified by a first notification portion $10A_{731}$, and an open state of the first opening and closing portion 4 of the third door 733 is notified by a first notification portion $10A_{733}$.

In addition, in a case where all of the second opening and closing portions 5 in each of the doors are in an open state, as illustrated in FIG. 21, an open state of the second opening and closing portion 5 of the first door 711 is notified by a second notification portion $10B_{711}$, an open state of the second opening and closing portion 5 of the second door 712 is notified by a second notification portion $10B_{712}$, an open state of the second opening and closing portion 5 of the first door 721 is notified by a second notification portion $10B_{721}$, an open state of the second opening and closing portion 5 of the second door 722 is notified by a second notification portion $10B_{722}$, an open state of the second opening and closing portion 5 of the first door 731 is notified by a second notification portion $10B_{731}$, and an open state of the second opening and closing portion 5 of the third door 733 is notified by a second notification portion $10B_{733}$.

In addition, for example, in a case where the second opening and closing portion 5 of the first door 721 is in an open state, the second opening and closing portion 5 of the second door 722 is in an open state, the second opening and closing portion 5 of the first door 731 is in an open state, and the first opening and closing portion 4 of the third door 733 is in an open state, as illustrated in FIG. 22, the open state of the second opening and closing portion 5 of the first door 721 is notified by the second notification portion $10B_{721}$, an open state of the second opening and closing portion 5 of the second door 722 is notified by the second notification portion $10B_{722}$, an open state of the second opening and closing portion 5 of the first door 731 is notified by the second notification portion $10B_{731}$, and an open state of the first opening and closing portion 4 of the third door 733 is notified by the first notification portion $10A_{733}$.

By the configuration, when confirming the display screen 301, it is possible to rapidly grasp which opening and closing portion of which door is in an open state.

In addition, in the inspection apparatus 1a, by one door, in a case where both of the first opening and closing portion 4 and the second opening and closing portion 5 are in an open state, a configuration in which the open state of the first opening and closing portion 4 is preferentially notified is employed.

In addition, after the notification by the first notification portion 10A or the second notification portion 10B, in a case where the movement of the moving portion of the device transport head 13 or the like is stopped, the inspection apparatus 1a may be configured to release the maintaining of the closed state by the first locking mechanism or the second locking mechanism. Accordingly, the operation of the predetermined switch is omitted, the first opening and closing portion 4 or the second opening and closing portion 5 can be in an open state, and excellent operability is achieved.

Next, for example, a program which instructs to close the opening and closing portion in an open state when one opening and closing portion of the first opening and closing portion 4 and the second opening and closing portion 5 is in an open state, will be described based on a flowchart illustrated in FIG. 23. Here, a case where the second opening and closing portion 5 is in an open state is employed as an example, When it is detected that the second opening and closing portion 5 is in an open state by the detection portion 77 (step S111), the open state of the second opening and closing portion 5 is notified by the second notification portion 10B (step S112), and a timer embedded in the control portion 80a is operated (step S113). In addition, during this, it is determined whether or not the humidity (or the temperature detected by the temperature sensor (not illustrated)) $\alpha$ detected by a humidity sensor (not illustrated) in the region in which the second opening and closing portion 5 is installed exceeds the threshold value $\alpha_0$ determined in advance (step S114). Here, the threshold value $\alpha_0$ is a humidity at which the low-temperature environment in the region can be in a state where the dew condensation is easily generated.

As a result of the determination in step S114, in a case where it is determined that the humidity $\alpha$ exceeds the threshold value $\alpha_0$, an instruction for closing the second opening and closing portion 5 in an open state is generated (step S115). The instruction means that the low-temperature environment in the region is shifting to a state where the dew condensation is easily generated, and can urge the operator to close the second opening and closing portion 5. In addition, the instruction is generated by using at least one of the monitor 300, the signal lamp 400, and the speaker 500.

After executing step S115, it is detected whether or not the second opening and closing portion 5 is in a closed state by the detection portion 77 (step S116).

In addition, as a result of the determination by step S114, in a case where it is determined that the humidity $\alpha$ does not exceed the threshold value $\alpha_0$, it is determined whether or not the time is up, that is, whether or not the predetermined time has elapsed by the control portion 80a (step S117). In step S117, in a case where it is determined that the time is up, the process moves to step S115, and then, the steps following step S115 are executed in order. When the predetermined time has elapsed, the low-temperature environment in the region can also be shifting to a state where the dew condensation is easily generated.

In addition, in a case where it is determined that the time is not up yet in step S117, the process moves to step S116.

Above, the electronic component transport apparatus and the electronic component inspection apparatus according to the invention are described based on the embodiments of the drawings, but the invention is not limited thereto, and each portion that configures the electronic component transport apparatus and the electronic component inspection apparatus can be replaced with an arbitrary configuration that can achieve similar functions. In addition, arbitrary configuration elements may be added.

In addition, the first opening and closing portion is supported to be rotatable in the above-described embodiments, but not being limited thereto, and for example, may be supported to be slidable in the horizontal direction In addition, the second opening and closing portion is supported to be rotatable in the above-described embodiments, but not being limited thereto, and for example, may be supported to be slidable in the horizontal direction.

In addition, the notification portion notifies the open and closed states of each of the first opening and closing portion and the second opening and closing portion in the embodiments, but not being limited thereto, for example, may notify the open and closed states of the first opening and closing portion, or may notify the open and closed states of the second opening and closing portion.

The entire disclosure of Japanese Patent Application Nos. 2015-051772, filed Mar. 16, 2015 and 2015-051778, filed Mar. 16, 2015 are expressly incorporated by reference herein.

The invention claimed is:

1. An electronic component handler comprising:
    a housing;
    a first door configured to move relative to the housing between an open position and a closed position; and
    a second door provided as a portion of the first door and configured to move relative to the first door between an open position and a closed position;
    wherein the electronic component handler includes a plurality of first doors.

2. The electronic component handler according to claim 1, wherein an area of the first door is greater than an area of the second door.

3. The electronic component handler according to claim 1, further comprising:
    a first hinge which supports the first door to be rotatable.

4. The electronic component handler according to claim 1, further comprising:

a second hinge which supports the second door to be rotatable.

5. The electronic component handler according to claim 4, further comprising:
a biasing portion disposed in the second hinge and biasing the second door in the closed position.

6. The electronic component handler according to claim 4, wherein the second hinge is disposed vertically above the second door in a plan view.

7. The electronic component handler according to claim 4, wherein the second door is open toward the inside or open toward the outside of the electronic component transport apparatus.

8. The electronic component handler according to claim 1, wherein the second door is supported to be slidable by the first door.

9. The electronic component handler according to claim 1, wherein a plurality of second doors are disposed in the plurality of first doors.

10. The electronic component handler according to claim 1, further comprising:
a transport area to which an electronic component is transported,
wherein the second door is disposed in the vicinity of the transport area.

11. The electronic component handler according to claim 10, wherein a placement portion in which the electronic component is placed is provided in the transport area, and
wherein the second door is disposed vertically above the placement portion in a plan view.

12. The electronic component handler according to claim 1, further comprising:
a first locking mechanism configured to lock the first door; and a second locking mechanism configured to lock the second door.

13. The electronic component handler according to claim 1, further comprising:
at least one locking mechanism configured to lock the first door and the second door.

14. An electronic component tester comprising:
a housing;
a first door configured to move relative to the housing between an open position and a closed position;
a second door provided as a portion of the first door and configured to move relative to the first door between an open position and a closed position; and
an inspection station supported by the housing and inspecting an electronic component,
wherein the electronic component tester includes a plurality of first doors.

* * * * *